US008440775B2

(12) United States Patent
Harimoto et al.

(10) Patent No.: US 8,440,775 B2
(45) Date of Patent: May 14, 2013

(54) CURABLE LIQUID COMPOSITION, METHOD OF COATING, INORGANIC SUBSTRATE, AND SEMICONDUCTOR DEVICE

(75) Inventors: Yukinari Harimoto, Hadano (JP); Maki Itoh, Tokyo (JP); Dimitris Elias Katsoulis, Midland, MI (US)

(73) Assignees: Dow Corning Corporation, Midland, MI (US); Dow Corning Toray Company, Ltd., Chiyoda-ku, Tokyo (JP)

( * ) Notice: Subject to any disclaimer, the term of this patent is extended or adjusted under 35 U.S.C. 154(b) by 753 days.

(21) Appl. No.: 12/525,429

(22) PCT Filed: Feb. 1, 2008

(86) PCT No.: PCT/JP2008/052087
§ 371 (c)(1),
(2), (4) Date: Dec. 28, 2009

(87) PCT Pub. No.: WO2008/099767
PCT Pub. Date: Aug. 21, 2008

(65) Prior Publication Data
US 2010/0089451 A1     Apr. 15, 2010

(30) Foreign Application Priority Data
Feb. 2, 2007   (JP) ................. 2007-024477

(51) Int. Cl.
*C08G 77/12*     (2006.01)
(52) U.S. Cl.
USPC ........................................... 528/31
(58) Field of Classification Search ....... 528/31
See application file for complete search history.

(56) References Cited

U.S. PATENT DOCUMENTS

| 5,091,162 A | * | 2/1992 | Frye et al. ............. 423/325 |
| 5,262,201 A | | 11/1993 | Chandra et al. |
| 5,916,944 A | | 6/1999 | Camilletti et al. |

FOREIGN PATENT DOCUMENTS

| EP | 0386969 A2 | 9/1990 |
| EP | 0410564 A2 | 1/1991 |
| JP | 06-345417 A | 12/1994 |
| JP | 11-106658 A | 4/1999 |
| WO | WO 2007-018283 A1 | 2/2007 |
| WO | WO 2007-046560 A2 | 4/2007 |

OTHER PUBLICATIONS

English language translation for JP 06-345417 extracted from PAJ database, dated Oct. 12, 2009, 36pages.
English language translation for JP 11-106658 extracted from PAJ database, dated Oct. 12, 2009, 35 pages.
PCT International Search Report for PCT/JP2006/315901, dated Jan. 22, 2007, 4 pages.
PCT International Search Report for PCT/JP2006/321587, dated Jul. 5, 2007, 4 pages.
PCT International Search Report for PCT/2008/052087, dated Dec. 10, 2008, 4 pages.

* cited by examiner

*Primary Examiner* — Kuo-Liang Peng
(74) *Attorney, Agent, or Firm* — Howard & Howard Attorneys PLLC

(57) ABSTRACT

A curable liquid composition obtained by subjecting hydrogen halosiloxane or hydrogen alkoxysilane to condensation or to hydrolysis and condensation in an organic solvent in which fine polyvalent metal oxide particles with hydroxyl groups are dispersed; a method of forming a hard silica-type layer by applying onto an inorganic substrate the aforementioned composition and then curing the composition; an inorganic substrate with the aforementioned hard silica-type layer; and a semiconductor device comprising the aforementioned inorganic substrate on which a semiconductor layer is formed.

8 Claims, 1 Drawing Sheet

CURABLE LIQUID COMPOSITION, METHOD OF COATING, INORGANIC SUBSTRATE, AND SEMICONDUCTOR DEVICE

RELATED APPLICATIONS

This application claims priority to and all the advantages of International Patent Application No. PCT/JP2008/052087, filed on Feb. 1, 2008, which claims priority to Japanese Patent Application No. JP2007-024477 filed on Feb. 2, 2007.

TECHNICAL FIELD

The present invention relates to a curable liquid composition comprising reaction products of fine particles of a polyvalent metal oxide having hydroxyl groups and a hydrogen halosilane or a hydrogen alkoxysilane, to a method of coating an inorganic substrate with the aforementioned curable liquid composition, and to a semiconductor device comprising an inorganic substrate having a silica-type layer that contains fine particles of polyvalent metal oxide along with a semiconductor layer on said inorganic substrate that has a silica-type layer containing fine particles of polyvalent metal oxide.

BACKGROUND ART

Japanese Unexamined Patent Application Publication (hereinafter referred to as "Kokai") No. H06-345417, i.e., JP 06-345417 A ("Patent Reference 1") discloses a process in which a coating composition that consists of a hydrogen silsesquioxane diluted with a solvent and a filler (such as glass, alumina, silica, colloidal silica, or titanium dioxide) is applied onto an electronic substrate (e.g., onto a substrate of a silicon wafer or a CMOS device), and then a ceramic film is formed by heating the coating for 45 minutes to 2.5 hours in air at a temperature of 50° C. to 800° C. The present inventors herein have found that since the filler contained in the aforementioned coating composition begins to precipitate immediately after preparation of the composition, the coating composition must be used for coating immediately after preparation, and if the coating composition containing the aforementioned precipitate is used for coating, a formed ceramic film will have defects such as non-uniformity and unevenness.

Kokai No. H11-106658, i.e., JP 11-106658 A (Patent Reference No. 2) discloses a process in which a hydrogen silsesquioxane resin composition that contains from 1 to 100 parts by weight of a colloidal silica (with average size of particles not exceeding 100 nm) per 100 parts by weight of the hydrogen silsesquioxane is applied as a coating onto semiconductor devices, electric devices, optical elements, or the like, and then cured in order to form silicon oxide films, such as silica-type films, with excellent insulating properties and optical transmittance. The aforementioned hydrogen silsesquioxane composition is produced by dispersing colloidal silica in an organic solvent, dissolving the hydrogen silsesquioxane in a solvent in a separate process, and then mixing both liquids.

However, the present inventors herein have found that a mixture of an organic solvent dispersed with colloidal silica and a solution obtained by dissolving a hydrogen silsesquioxane resin in a solvent begins to form precipitates within a few minutes after mixing, and, therefore, the mixture should be immediately used for coating; otherwise, a formed silicon oxide film will have defects such as non-uniformity and unevenness.

SUMMARY OF THE INVENTION

In order to solve the problems of the prior-art technique, the present inventors have conducted profound studies to find the following facts, whereby have arrived at the present invention.

A composition obtained by causing a condensation reaction or a reaction of hydrolysis and condensation between a hydrogen halosilane or a hydrogen alkoxysilane in an organic solvent that contains fine particles of a polyvalent metal oxide with hydroxyl groups dispersed in the solvent demonstrates excellent post-preparation storage stability and, when cured by heating, can form a hard silica-type layer that contains fine particles of the polyvalent metal oxide.

A composition obtained by subjecting a metal alkoxylate or a metal halide in an organic solvent to hydrolysis and condensation and then subjecting a hydrogen halosilane or hydrogen alkoxysilane to a reaction of condensation or to a reaction of hydrolysis and condensation in the aforementioned organic solvent demonstrates excellent post-preparation storage stability and, when cured by heating, can form a hard silica-type layer that contains fine particles of the polyvalent metal oxide.

When the aforementioned curable liquid composition is applied as a coating onto an inorganic substrate and cured by heating, the composition can form hard silica-type layer that contains fine particles of the polyvalent metal oxide, and can form a uniform and even coating layer which is free of cracks and which tightly adheres to the surface of the substrate.

The inorganic substrate having the aforementioned hard silica-type layer that contains fine particles of the polyvalent metal oxide is suitable for forming a semiconductor layer on said substrate.

It is an object of the present invention to provide a curable liquid composition that demonstrates excellent storage stability after preparation and, when cured by heating, forms a hard silica-type layer that contains fine particles of a polyvalent metal oxide.

It is another object of the present invention to provide a method of forming a coating on an inorganic substrate that makes it possible to form a hard silica-type layer which tightly adheres to the aforementioned substrate, is free of non-uniformity and unevenness, and is resistant to cracking.

It is a further object of the present invention to provide an inorganic substrate that has a hard silica-type layer which tightly adheres to the aforementioned substrate, is free of non-uniformity and unevenness, resists cracking, and is characterized by excellent thermal resistance, frost resistance, electrical insulating properties, mechanical strength, resistance to chemicals, etc.

It is still a further object to provide a semiconductor device that has a semiconductor layer formed on an inorganic substrate having a hard silica-type layer which tightly adheres to the aforementioned substrate, is free of non-uniformity and unevenness, and resists cracking, said semiconductor layer being characterized by high purity, reliability, and long-term stability.

The present invention relates to the following [1], [4], [7], [9], and [10]:

[1] A curable liquid composition obtained by subjecting a silane compound represented by the following general formula (1):

$$H_n SiX_{4-n}$$

(where X represents a halogen atom or an alkoxy group with 1 to 4 carbon atoms and "n" is 0, 1, or 2) (along with a silane compound wherein n=1 or a silane compound wherein n=2, when n=0 in the above formula) to a reaction of condensation, or to a reaction of hydrolysis with condensation, in an organic solvent that contains dispersed fine particles of polyvalent metal oxide having hydroxyl groups.

[4] A curable liquid composition obtained by subjecting a metal halide or a metal alkoxylate represented by the following general formula (2):

MX$_m$ (where M represents a polyvalent metal atom, X represents a halogen atom or an alkoxyl group with 1 to 4 carbon atoms, and "m" is the valence of the polyvalent metal atom) to hydrolysis and condensation in an organic solvent, and then subjecting a silane compound represented by the following general formula (1):

H$_n$SiX$_{4-n}$ (where X represents a halogen atom or an alkoxy group with 1 to 4 carbon atoms and "n" is 0, 1, or 2) (along with a silane compound wherein n=1 or a silane compound wherein n=2, when n=0 in the above formula) to a reaction of condensation, or to a reaction of hydrolysis and condensation, in the aforementioned organic solvent.

[7] A method of coating an inorganic substrate wherein an inorganic substrate is coated with a curable liquid composition according to [1] or [4] with subsequent curing of a curable component of said coating, whereby a silica-type layer that contains fine particles of polyvalent metal oxide and that has a pencil hardness in the range of 4H to 9H is formed on said inorganic substrate.

[9] An inorganic substrate characterized by having a silica-type layer that contains fine particles of polyvalent metal oxide and that has pencil hardness in the range of 4H to 9H.

[10] A semiconductor device that has an inorganic substrate of [9] with a silica layer that contains fine particles of polyvalent metal oxide, wherein a semiconductor layer is formed at least on said silica layer.

DISCLOSURE OF THE INVENTION

Figure 1:
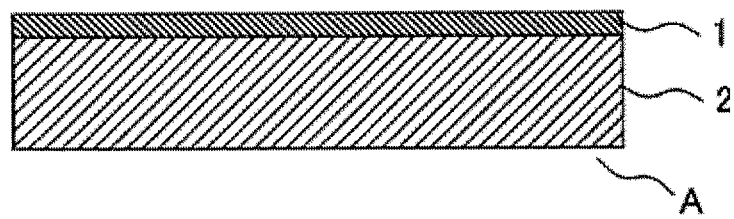
FIG. 1 is a cross-sectional view of a thin stainless steel plate "A" that comprises a thin stainless steel plate 2, one side of which has a thin silica-type coating layer 1 obtained in Example 15.
Figure 2:
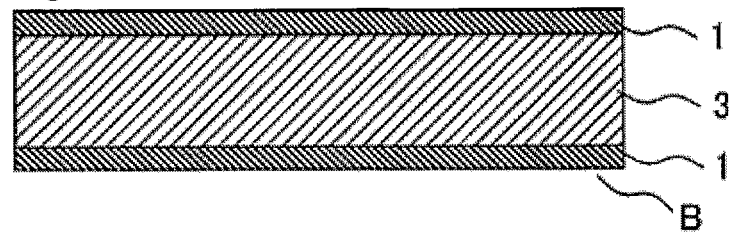
FIG. 2 is a cross-sectional view of a thin glass plate "B", both sides of which has a thin silica-type coating layer 1 obtained in Example 18.
Figure 3:
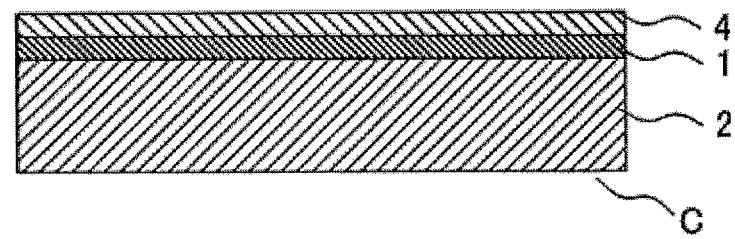
FIG. 3 is a cross-sectional view of a semiconductor device "C" according to one embodiment of the present invention having a semiconductor layer 4 on the surface of the thin silica-type layer 1 of the stainless steel plate A that has a thin silica-type layer 1 on one side of the stainless steel plate 2.

The present invention particularly relates to the following [1], [1-1], [2], [2-1], [3], [3-1], and [3-2].

[1] A curable liquid composition obtained by subjecting a silane compound represented by the following general formula (1):

H$_n$SiX$_{4-n}$ (where X represents a halogen atom or an alkoxy group with 1 to 4 carbon atoms and "n" is 0, 1, or 2) (along with a silane compound wherein n=1 or a silane compound wherein n=2, when n=0 in the above formula) to a reaction of condensation, or to a reaction of hydrolysis and condensation, in an organic solvent that contains dispersed fine particles of a polyvalent metal oxide having hydroxyl groups.

[1-1] The curable liquid composition of [1] characterized by the fact that after the reaction of condensation or after the reaction of hydrolysis and condensation, byproducts are removed by distillation.

[2] The curable liquid composition of [1] wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina.

[2-1] The curable liquid composition of [1-1], wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina.

[3] The curable liquid composition of [1], wherein the aforementioned silane compound is represented by one or more types of silane compounds selected from the group consisting of dihydrogen dichlorosilane, hydrogen trichlorosilane, dihydrogen dimethoxysilane, dihydrogen diethoxysilane, hydrogen trimethoxysilane, hydrogen triethoxysilane, tetrachlorosilane, and tetraethoxysilane (along with the aforementioned hydrogen silane compound, in case of tetrachlorosilane or tetraethoxysilane).

[3-1] The curable liquid composition of [1-1], wherein the aforementioned silane compound is represented by one or more types of silane compounds selected from the group consisting of dihydrogen dichlorosilane, hydrogen trichlorosilane, dihydrogen dimethoxysilane, dihydrogen diethoxysilane, hydrogen trimethoxysilane, hydrogen triethoxysilane, tetrachlorosilane, and tetraethoxysilane (along with the aforementioned hydrogen silane compound, in case of tetrachlorosilane or tetraethoxysilane).

[3-2] The curable liquid composition according to [1] or [1-1], wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina, and wherein the aforementioned silane compound is represented by one or more types of silane compounds selected from the group consisting of dihydrogen dichlorosilane, hydrogen trichlorosilane, dihydrogen dimethoxysilane, dihydrogen diethoxysilane, hydrogen trimethoxysilane, hydrogen triethoxysilane, tetrachlorosilane, and tetraethoxysilane (along with the aforementioned hydrogen silane compound, in case of tetrachlorosilane or tetraethoxysilane).

The present invention further relates to the following [4], [5], [5-1], [6], [6-1], and [6-2].

[4] A curable liquid composition obtained by subjecting a metal halide or a metal alkoxylate represented by the following general formula (2):

(where M represents a polyvalent metal atom, X represents a halogen atom or an alkoxyl group with 1 to 4 carbon atoms, and "m" is the valence of the polyvalent metal atom) to hydrolysis and condensation in an organic solvent and then subjecting a silane compound represented by the following general formula (1):

(where X represents a halogen atom or an alkoxy group with 1 to 4 carbon atoms and "n" is 0, 1, or 2) (along with a silane compound wherein n=1 or a silane compound wherein n=2, when n=0 in the above formula) to a reaction of condensation, or to a reaction of hydrolysis and condensation, in the aforementioned organic solvent.

[4-1] The liquid curable composition of Item [4], wherein after the reaction of condensation or after the reaction of hydrolysis and condensation, byproducts are removed by distillation.

[5] The invention further relates to the liquid curable composition of [4], wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina.

[5-1] The liquid curable composition of [4-1], wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina.

[6] The liquid curable composition of [4], wherein the silane compound is represented by one or more types of silane compounds selected from the group consisting of dihydrogen dichlorosilane, hydrogen trichlorosilane, dihydrogen dimethoxysilane, dihydrogen diethoxysilane, hydrogen trimethoxysilane, hydrogen triethoxysilane, tetrachlorosilane, and tetraethoxysilane (along with the aforementioned hydrogen silane compound, in case of tetrachlorosilane or tetraethoxysilane).

[6-1] The liquid curable composition of [4-1], wherein the silane compound is represented by one or more types of silane compounds selected from the group consisting of dihydrogen dichlorosilane, hydrogen trichlorosilane, dihydrogen dimethoxysilane, dihydrogen diethoxysilane, hydrogen trimethoxysilane, hydrogen triethoxysilane, tetrachlorosilane, and tetraethoxysilane (along with the aforementioned hydrogen silane compound, in case of tetrachlorosilane or tetraethoxysilane).

[6-2] The liquid curable composition according to [4] or [4-1], wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina, and wherein the aforementioned silane compound is represented by one or more types of silane compounds selected from the group consisting of dihydrogen dichlorosilane, hydrogen trichlorosilane, dihydrogen dimethoxysilane, dihydrogen diethoxysilane, hydrogen trimethoxysilane, hydrogen triethoxysilane, tetrachlorosilane, and tetraethoxysilane (along with the aforementioned hydrogen silane compound, in case of tetrachlorosilane or tetraethoxysilane).

The present invention further relates to the following [7], [7-1], [8], [8-1], [9], and [9-1].

[7] A method of application of a coating on an inorganic substrate, wherein an inorganic substrate is coated with a curable liquid composition according to [1] or [4] with subsequent curing of a curable component of the coating, whereby a silica-type layer that contains fine particles of polyvalent metal oxide and that has a pencil hardness in the range of 4H to 9H is formed on said inorganic substrate.

[7-1] The method of application of a coating on an inorganic substrate, wherein an inorganic substrate is coated with a curable liquid composition according to Items [1-1], [2], [2-1], [3], [3-1], [3-2], [4-1], [5], [5-1], [6], [6-1] or [6-2] with subsequent curing of a curable component of the coating, whereby a silica-type layer that contains fine particles of polyvalent metal oxide and that has a pencil hardness in the range of 4H to 9H is formed on said inorganic substrate.

[8] The method of coating an inorganic substrate according to [7], wherein curing is carried out by heating at a temperature no less than 150° C. in an oxygen-containing atmosphere, heating at a temperature no less than 200° C. in an inert gas or in a vacuum, irradiating with a high-energy beam, exposing to ozone, exposing to nitrous oxide gas, or exposing to wet ammonia gas.

[8-1] The method of coating an inorganic substrate according to [7-1], wherein curing is carried out by heating at a temperature no less than 150° C. in an oxygen-containing atmosphere, heating at a temperature no less than 200° C. in an inert gas or in a vacuum, irradiating with a high-energy beam, exposing to ozone, exposing to nitrous oxide gas, or exposing to wet ammonia gas.

[9] An inorganic substrate characterized by having a silica-type layer that contains fine particles of polyvalent metal oxide and that has a pencil hardness in the range of 4H to 9H.

[9-1] The inorganic substrate of [9], wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina, and wherein the aforementioned substrate is a metal substrate, ceramic substrate, or a glass substrate.

The present invention further relates to the following [10], [10-1], [11], and [11-1].

[10] A semiconductor device that has the inorganic substrate of [9] with a silica layer that contains fine particles of polyvalent metal oxide, wherein a semiconductor layer is formed at least on said silica layer.

[10-1] The semiconductor device of [10], wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina, and wherein the aforementioned substrate is a metal substrate, ceramic substrate, or a glass substrate.

[11] The semiconductor device of [10], wherein the inorganic substrate is a thin glass plate or a thin stainless steel plate, the semiconductor layer is a thin silicon semiconductor layer, or a compound-type semiconductor layer, and wherein said semiconductor device is a thin film solar cell.

[11-1] The semiconductor device of [10-1], wherein the inorganic substrate is a thin glass plate or a thin stainless steel plate, the semiconductor layer is a thin silicon semiconductor layer, or a compound-type semiconductor layer, and wherein said semiconductor device is a thin film solar cell.

The present invention further relates to the following [14], [14-1], [14-2], [14-3], [14-4], and [14-5].

[14] A method of preparation of a curable liquid composition by subjecting a silane compound represented by the following general formula (1):

$H_nSiX_{4-n}$ (where X represents a halogen atom or an alkoxy group with 1 to 4 carbon atoms and "n" is 0, 1, or 2) (along with a silane compound wherein n=1 or a silane compound wherein n=2, when n=0 in the above formula) to a reaction of condensation, or to a reaction of hydrolysis with condensation, in an organic solvent that contains dispersed fine particles of polyvalent metal oxide having hydroxyl groups.

[14-1] The method of preparation of a curable liquid composition according to [14], wherein X is an alkoxyl group with 1 to 4 carbon atoms and wherein the composition contains water for hydrolysis of the silane compound of formula (1).

[14-2] The method of preparation of a curable liquid composition according to [14-1], wherein the reaction is carried out in the presence of an acidic catalyst.

[14-3] The method of preparation of a curable liquid composition according to [14-2], wherein the acidic catalyst is a hydrohalic acid.

[14-4] The method of preparation of a curable liquid composition according to [14-3], wherein after completion of the reaction the hydrohalic acid and an alcohol with 1 to 4 carbon atoms which is formed as a byproduct of the hydrolysis of the silane compound represented by general formula (1) are removed by distillation.

[14-5] The method of preparation of a curable liquid composition according to [14], wherein X is a halogen atom and wherein after completion of the reaction, the hydrohalic acid, which is formed as a byproduct of the hydrolysis of the silane compound represented by general formula (1), is removed by distillation.

The present invention further relates to the following [15], [15-1], [15-2], [16], [17], [17-1], [17-2] and [17-3].

[15] Fine particles of polyvalent metal oxides bonded to dihydrogen siloxane, dihydrogen polysiloxane, hydrogen siloxane, or hydrogen polysiloxane which are represented by the following average unit formula (8): $\{[H_2SiO_{2/2}]_x[HSiO_{3/2}]_y[SiO_{4/2}]_z\}_v[MO_{a/2}]_w$ (where x, y, and z express mole concentrations and where the following conditions are observed: $0 \leq x \leq 1.0$; $0 \leq y \leq 1.0$; $0 \leq z \leq 0.5$; $0.5 \leq (x+y) \leq 1.0$; $(x+y+z)=1$; "v" and "w" are mass percentages having the following relationships: $0<v<1.0$; $0<w<1.0$; $(v+w)=1$; M represents a polyvalent metal atom in the fine polyvalent metal oxide particle; and "a" is the valence of the polyvalent metal atom).

[15-1] A curable liquid composition comprising the fine polyvalent metal oxide particles of [15] and the following components in a free state: dihydrogen polysiloxane, hydrogen polysiloxane, or dihydrogen polysiloxane and hydrogen polysiloxane.

[15-2] The curable liquid composition of [15-1], further comprising an organic solvent.

[16] A coating agent for application onto an inorganic substrate, wherein the aforementioned coating is made from the curable liquid composition as disclosed in [15-2].

[17] The method of application of a coating onto an inorganic substrate, wherein the inorganic substrate is coated with a coating agent of [16] which is then cured and forms a silica-type layer having a pencil hardness in the range of 4H to 9H.

[17-1] The method of coating as disclosed in [17], wherein the inorganic substrate is a metal substrate, ceramic substrate, or a glass substrate.

[17-2] The method of coating an inorganic substrate as disclosed in [17-1], wherein the metal substrate is a thin stainless steel substrate.

[17-3] The coating is carried out by heating at a temperature no less than 150° C. in an oxygen-containing atmosphere, heating at a temperature no less than 200° C. in an inert gas or in a vacuum, irradiating with a high-energy beam, exposing to ozone, exposing to nitrous oxide gas, or to wet ammonia gas.

The curable liquid composition of the present invention is characterized by excellent storage stability without separation of the components even after a prolonged time. The composition can be easily cured by heating and turned into a cured body of hard silica that contains fine particles of polyvalent metal oxide.

The coating method of the present invention makes it possible to form on an inorganic substrate a hard silica-type layer that is characterized by strong adhesion to the substrate and by properties such as resistance to cracking, uniformity, and smooth surface.

Since the inorganic substrate of the present invention has a crack-resistant, uniform, and smooth surface and contains a hard silica-type layer that contains fine particles of polyvalent metal oxide and that has strong adhesion to the substrate, the latter is characterized by excellent resistance to heat, resistance to frost, electrical insulating properties, mechanical strength, and resistance to chemicals.

Since the semiconductor device of the present invention is produced with a semiconductor layer on an inorganic substrate which has a hard silica-type layer characterized by properties such as strong adhesion to the substrate, uniformity, smoothness, and resistance to cracking, the aforementioned semiconductor device is characterized by purity, reliability, and long-term storage stability.

BEST MODE FOR CARRYING OUT THE INVENTION

A curable liquid composition of the present invention is obtained by subjecting a silane compound represented by the following general formula (1):

$$H_2SiX_{4-n} \qquad (1)$$

(where X represents a halogen atom or an alkoxy group with 1 to 4 carbon atoms and "n" is 0, 1, or 2) (along with a silane compound wherein n=1 or a silane compound wherein n=2, when n=0 in the above formula) to a reaction of condensation, or to a reaction of hydrolysis with condensation, in an organic solvent that contains dispersed fine particles of polyvalent metal oxide having hydroxyl groups.

The organic solvent dispersion of fine particles of the polyvalent metal oxide having hydroxyl groups, e.g., of fine silica particles having silanol groups, is commercially available.

Examples of such commercial products are the following: silica sol dispersed in methanol (trademark; MT-ST, the product of NISSAN CHEMICAL INDUSTRIES, LTD.; 30 mass % concentration of SiO$_2$; 12 nm average particle size; 1.8 mass % water content; and 30 nm particle size determined by dynamic light-scattering method); silica sol dispersed in isopropyl alcohol (trademark; IPA-ST, the product of NISSAN CHEMICAL INDUSTRIES, LTD.; 30 mass % concentration of SiO$_2$; 12 nm average particle size; 1.8 mass % water content; and 30 nm particle size determined by dynamic light-scattering method); and toluene dispersion colloidal silica (trademark; TOL-ST, the product of NISSAN CHEMICAL INDUSTRIES, LTD.; 40 mass % concentration of SiO$_2$; 10 nm to 20 nm average particle size).

Fine particles of polyvalent metal oxide other than silica fine particles are exemplified by fine particles of titanium oxide (titania), fine particles of zirconium oxide (zirconia), and fine particles of aluminum oxide (alumina), as well as fine particles of tin oxide and fine particles of zinc oxide.

A tin oxide sol and titanium oxide sol having hydroxyl groups are commercially available from Taki Chemical Co., Ltd. An alumina sol having hydroxyl groups are commercially available from Kawaken Fine Chemicals Co., Ltd. (trademark: Alumisol-10; 10% aqueous solution of boehmite alumina colloid).

The organic solvent dispersion of fine particles of the polyvalent metal oxide having hydroxyl groups, e.g., silica fine particles with silanol groups, can be prepared by mixing a silane compound of general formula (3):

$$SiX_4 \qquad (3)$$

(where X represents a halogen atom or an alkoxy group with 1 to 4 carbon atoms) with a water-soluble organic solvent and a nonpolar organic solvent to uniformity without separation into two layers in a mixed ratio, e.g., (100:80) to (100:200), then adding water to the mixed organic solvent in an amount required for hydrolysis of the aforementioned silane compound, stirring the mixture, and conducting a reaction of hydrolysis and condensation.

The following are examples of silane compounds of formula (3) which are used as starting materials: tetrachlorosilane, tetrabromosilane, tetramethoxysilane, tetraethoxysilane, tetrapropoxysilane, and tetrabutoxysilane. Tetrachlorosilane and tetrabromosilane are characterized by strong hydrolyzability, tetramethoxysilane is highly volatile, but tetraethoxysilane is the most desirable for use since it has appropriate hydrolyzability and low volatility.

The following are examples of the water-soluble organic solvents: methanol, ethanol, isopropanol, or similar alcohols; ethylene glycol monomethyl ether, ethylene glycol monoethyl ether, or similar lower alkylene glycol monoalkyl ethers. The nonpolar organic solvents are exemplified by toluene, xylene, or similar aromatic hydrocarbon solvents; and pentane, hexane, heptane, octane, or similar lower aliphatic hydrocarbon solvents.

When all X's in the silane compound of general formula (3) are alkoxyl groups with 1 to 4 carbon atoms, then the silane compound must be used in combination with a hydrolysis catalyst. The following are examples of hydrolysis catalysts: acidic catalysts such as hydrochloric acid, sulfuric acid, nitric acid, phosphoric acid, formic acid, acetic acid, oxalic acid, methane sulfonic acid, ethane sulfonic acid, 2-hydroxyethane sulfonic acid, benzene sulfonic acid, and toluene sulfonic acid. Among these, most preferable are hydrochloric acid, sulfuric acid, nitric acid, phosphoric acid, formic acid, acetic acid, and oxalic acid, especially hydrochloric acid and phosphoric acid. The hydrolysis catalyst should be added in an amount of 0.1 to 5 parts by mass, preferably 0.5 to 2 parts by mass per 100 parts by mass of the silane compound of general formula (3).

The hydrolysis and condensation reaction temperature ranges from room temperature to 50° C. Better conditions for disintegration of silica, which is a product of the hydrolysis and condensation reaction, into fine particles are achieved when the reaction solution is stirred or shaken. Duration of the hydrolysis and condensation reaction is selected from the condition wherein a silane compound, which is used as a starting material, is completely consumed. Normally, the reaction time ranges from 30 minutes to 3 hours.

Fine particles of the polyvalent metal oxide with hydroxyl groups other than the fine silica particles with silanol groups can be prepared by subjecting a polyvalent metal halide or polyvalent metal alkoxylate to hydrolysis in an organic solvent. The aforementioned metal halide and metal alkoxylate are represented by the following general formula (2):

$$MX_m \qquad (2)$$

(where M represents a polyvalent metal atom other than a silicon atom, X represents a halogen atom or an alkoxyl group with 1 to 4 carbon atoms, and "m" is a valence of the polyvalent metal atom) to hydrolysis and condensation in an organic solvent.

Examples of polyvalent metal compounds of formula (2) are the following: tetrachlorotitanium, tetrabromotitanium, tetramethoxytitanium, tetraethoxytitanium, tetrapropoxytitanium, tetrabutoxytitanium; tetrachlorozirconium, tetrabromozirconium, tetramethoxyzirconium, tetraethoxyzirconium, tetrapropoxyzirconium, tetrabutoxyzirconium; trichloroaluminum, tribromoaluminum, trimethoxyaluminum, triethoxyaluminum, tripropoxyaluminum, and tributoxyaluminum.

Metal chlorides and metal bromides possess high hydrolizability, but the use of metal alkoxylates is preferable because they have appropriate hydrolizability in combination with relatively low volatility.

The fine polyvalent metal oxide particles with hydroxyl groups may comprise composite fine particles of silanol-containing silica and polyvalent metal oxide with hydroxyl groups. An appropriate organic solvent dispersion of the composite fine particles can be easily prepared by subjecting the silane compound of general formula (3) and the polyvalent metal compound of general formula (2) to co-hydrolysis and co-condensation. For example, fine composite particles of silica-titania with hydroxyl groups (including silanol groups), fine composite particles of silica-zirconia having hydroxyl groups (including silanol groups), or fine composite particles of silica-alumina having hydroxyl groups can be prepared by subjecting tetrahalide or tetraalkoxylane of general formula (3): SiX$_4$ (where X is a halogen atom or an alkoxyl group with 1 to 4 carbon atoms), to co-hydrolysis and to co-condensation with a titanium compound of general formula (4): TiX$_4$, a zirconium compound of general formula (5): ZrX$_4$, or an aluminum compound of general formula (6): AlX$_3$ (where X is a halogen atom or an alkoxyl group with 1 to 4 carbon atoms)

During co-hydrolysis and co-condensation of the silane compound of formula (3) together with the titanium compound of formula (4), the above components are dissolved in an organic solvent, water is added in the amount needed for hydrolysis, and the components should be stirred or shaken. Since the titanium compound possesses catalytic action with regard to hydrolysis of tetraalkoxysilane, there is no need to add a catalyst. Co-condensation of the aforementioned titanium compound and silane compound proceeds with separation of hydrogen halide or alcohol and with subsequent precipitation of fine composite silica-titania particles that contain hydroxyl groups (including silanol groups). As a result, an organic solvent dispersion of fine composite silica-titania particles that contain hydroxyl groups (including silanol groups) is formed.

During co-hydrolysis and co-condensation of the silane compound of formula (3) together with the zirconium compound of formula (5), the above components are dissolved in an organic solvent, water is added in the amount needed for hydrolysis, and the components should be stirred or shaken. Since the zirconium compound possesses catalytic action with regard to the silane compound, there is no need to add a catalyst. Co-condensation of the aforementioned zirconium compound and silane compound proceeds with separation of hydrogen halide or alcohol and with subsequent precipitation of fine composite silica-zirconia particles that contain hydroxyl groups (including silanol groups). As a result, an organic solvent dispersion of fine composite silica-zirconia particles that contain hydroxyl groups (including silanol groups) is formed.

During co-hydrolysis and co-condensation of the silane compound of formula (3) together with the aluminum compound of formula (6), the above components are dissolved in an organic solvent, water is added in the amount needed for hydrolysis, and the components should be stirred or shaken. Since the aluminum compound possesses catalytic action with regard to the tetraalkoxysilane compound, there is no need to add a catalyst. Co-condensation of the aforementioned aluminum compound and silane compound proceeds with separation of hydrogen halide or alcohol and with subsequent formation of fine composite silica-alumina particles that contain hydroxyl groups (including silanol groups). As a result, an organic solvent dispersion of fine composite silica-alumina particles that contain hydroxyl groups (including silanol groups) is formed.

If necessary, any combination of the two or three of the titanium compound of general formula (4), the zirconium compound of general formula (5), and the aluminum compound of general formula (6), can be subjected to co-hydrolysis and co-condensation. For example, the above procedure makes it possible to obtain fine composite particles of silica-titania-zirconia, silica-titania-alumina, silica-zirconia-alumina, or silica-titania-zirconia-alumina, each combination having hydroxyl groups (including silanol groups).

It is recommended that the content of the fine polyvalent metal oxide particles in the organic solvent dispersion of the fine polyvalent organic oxide particles with hydroxyl groups be in the range of 10 to 40 parts by mass.

If the average size of the fine polyvalent organic oxide particles with hydroxyl groups is too large, this will facilitate their precipitation in the organic solvent. Therefore, it is recommended that the particles have an average size in the range of 5 to 100 nm. In the context of the present invention, the average size of fine polyvalent organic oxide particles with hydroxyl groups in the organic solvent means the average size measured by a dynamic light-scattering method.

There are no special restrictions with regard to the shape of the fine polyvalent organic oxide particles with hydroxyl groups, and the particles may be spherical, spindle-like, prismatic, cylindrical, or irregular in shape.

The silane compound of general formula (1): $H_nSiX_{4-n}$ (where X represents a halogen atom or an alkoxy group with 1 to 4 carbon atoms and "n" is 1 or 2) is a silane that may have one or two hydrogen atoms bonded to the silicon atom and three or two halogen atoms or alkoxyl groups bonded to the silicon atom. Such a silane may have in one molecule a halogen atom and an alkoxy group with 1 to 4 carbon atoms.

Since a silane compound with "n" equal 4, such as tetrachlorosilane or tetraethoxysilane, does not have silicon-bonded hydrogen atoms, it is necessary to use it in combination with a silane of n=1, a silane of n=2, or a mixture of a silane of n=1 with a silane of n=2.

A halogen atom designated by X is most normally a chlorine atom, and a bromine atom after that. The alkoxyl group with 1 to 4 carbon atoms may be represented by a methoxy group, ethoxy group, propoxy group, or butoxy group.

The following are specific examples of the aforementioned silane compounds: $HSiCl_3$, $H_2SiCl_2$, $HSiBr_3$, $H_2SiBr_2$, $HSi(OCH_3)_3$ (hydrogen trimethoxysilane), $H_2Si(OCH_3)_2$ (dihydrogen dimethoxysilane), $HSi(OC_2H_5)_3$ (hydrogen trimethoxysilane), $H_2Si(OC_2H_5)_2$ (dihydrogen diethoxysilane), $H_2Si(OC_3H_7)_2$ (dihydrogen dipropoxysilane), $HSi(OC_3H_7)_3$ (hydrogen tripropoxysilane), and $H_2SiCl(OCH_3)$ (dihydrogen chloromethoxysilane), $HSiCl(OC_2H_5)_2$ (hydrogen chlorodiethoxysilane).

Such silanes can be used in a combination of two or more.

The curable liquid composition of the present invention is prepared by subjecting a silane compound represented by the following general formula (1):

(where X represents a halogen atom or an alkoxy group with 1 to 4 carbon atoms and "n" is 0, 1, or 2) (along with a silane compound wherein n=1 or a silane compound wherein n=2, when n=0 in the above formula) to a reaction of condensation, or to a reaction of condensation or hydrolysis and condensation, in an organic solvent that contains dispersed fine particles of polyvalent metal oxide having hydroxyl groups.

The silane compound of general formula (1) can be loaded into the organic solvent dispersion of the aforementioned hydroxyl-group-containing fine polyvalent metal oxide particles without any pretreatment and stirred in the dispersion. However, the reaction will be more uniform if prior to loading and stirring the silane compound is dispersed or dissolved in a non-protonic organic solvent.

Examples of such non-protonic organic solvents are the following: pentane, hexane, heptane, octane, isooctane (2,2,4-triethylpentane), nonane, decane, or a similar aliphatic hydrocarbon; cyclopentane, cyclohexane, cycloheptane, ethyl cyclohexane, cyclooctane, diethyl cyclohexane, decaline (decahydronaphaline), or a similar alicyclic hydrocarbon solvent; benzene, toluene, xylene, ethylbenzene, pseudocumene (triethylbenzene), tetralin (1,2,3,4-tetrahydronaphthalene), or a similar aromatic hydrocarbon solvent; acetone, and methyl isobutyl ketone (MIBK), or a similar aliphatic ketone.

If all X's in the silane compound of general formula (1) are halogen atoms, then a dehydrogenization condensation reaction occurs with regard to the hydroxyl groups of the fine particles of polyvalent metal oxide, and by subjecting the aforementioned particles to surface treatment it becomes possible to obtain fine particles of polyvalent metal oxide bonded to dihydrogen siloxane or hydrogen siloxane.

When the curable liquid composition is prepared by hydrolysis and condensation and if the silane compound of general formula (1) contains halogen atoms (i.e., if X designates a halogen atom), then only water, which is required for hydrolysis, may be added to the reaction system. However, if the silane compound does not contain halogen atoms (e.g., when all X's are alkoxyl groups with 1 to 4 carbon atoms), then water for hydrolysis should be added together with a catalyst.

Water should be added in an amount sufficient for hydrolysis of silicon-bonded alkoxyl groups.

The catalyst may be a silane compound of general formula (1), i.e., a compound capable of hydrolyzing the hydrogen alkoxysilane, an inorganic acid, or organic acid. Inorganic acid is exemplified by hydrohalic acid, sulfuric acid, and phosphoric acid. Organic acid is exemplified by formic acid, oxalic acid, acetic acid, methanesulfonic acid, ethanesulfonic acid, 2-hydroxyethanesulfonic acid, benzenesulfonic acid, and toluenesulfonic acid.

It is recommended to use a catalyst of the type that can be easily removed from the system after the hydrolysis and condensation reaction. For this purpose, use of hydrohalic acid is preferable. Examples of such an acid are hydrochloric acid and hydrobromic acid, wherein hydrochloric acid is preferable. A compound generating a hydrohalic acid when hydrolyzed also can be used.

It is understood that fine particles of the polyvalent metal oxide bonded to dihydrogen siloxane or to hydrogen siloxane can be obtained by hydrolyzing a silane compound of general formula (1) (where at least one X is a halogen atom), thus forming a hydrohalic acid (e.g., hydrochloric acid) and dihydrogen siloxane or hydrogen siloxane, and then by subjecting the dihydrogen siloxane or hydrogen siloxane having silanol groups and the fine particles of polyvalent metal oxide having hydroxyl groups to dehydration and condensation by using the catalytic action of hydrohalic acid (e.g., of a hydrochloric acid).

Alternatively, under the effect of autocondensation of the dihydrogen siloxane or hydrogen siloxane having silanol groups caused by the catalytic action of the dihydrogen siloxane, hydrogen polysiloxane or hydrogen siloxane with silanol groups is formed, and the fine particles of polyvalent metal oxide bonded to dihydrogen siloxane and to hydrogen siloxane can be formed by subjecting the aforementioned silanol groups and hydroxyl groups of the fine particles of polyvalent metal oxide to dehydration and condensation.

It is further understood that fine particles of polyvalent metal oxide bonded to dihydrogen siloxane or to hydrogen siloxane also can be formed by subjecting the silane compound of general formula (1) (where all X's represent alkoxyl groups with 1 to 4 carbon atoms) to hydrolysis under catalytic action (e.g., of hydrohalic acid such as hydrochloric acid) thud forming a dihydrogen siloxane or hydrogen siloxane having silanol groups, and then subjecting the dihydrogen siloxane or hydrogen siloxane having silanol groups and the hydroxyl groups of the fine particles of polyvalent metal oxide (e.g., silanol groups of the fine silica particles) to dehydration and condensation under catalytic action of the acidic catalyst (e.g., hydrohalic acid such as hydrochloric acid).

It is further understood that fine particles of polyvalent metal oxide bonded to dihydrogen siloxane or to hydrogen siloxane also can be formed by causing autocondensation of the resulting hydrogen siloxane or dihydrogen polysiloxane with silanol groups under the catalytic action of an acidic catalyst (e.g., of hydrohalic acid such as hydrochloric acid), thus forming dihydrogen polysiloxane or hydrogen polysiloxane with silanol groups and then subjecting the aforementioned silanol groups and hydroxyl groups of the fine particles of polyvalent metal oxide to dehydration and condensation.

The following embodiments are possible: bonding dihydrogen siloxane or hydrogen siloxane through SiOM bonds (where M designates a metal atom) to the fine polyvalent metal oxide particles;

bonding dihydrogen polysiloxane or hydrogen polysiloxane through SiOM bonds (where M designates a metal atom) to the fine polyvalent metal oxide particles;

bonding dihydrogen siloxane and dihydrogen polysiloxane through SiOM bonds (where M designates a metal atom) to the fine polyvalent metal oxide particles; bonding hydrogen siloxane and hydrogen polysiloxane through SiOM bonds (where M designates a metal atom) to the fine polyvalent metal oxide particles; and bonding dihydrogen polysiloxane and hydrogen polysiloxane through SiOM bonds (where M designates a metal atom) to the fine polyvalent metal oxide particles.

It is not necessary that all the aforementioned dihydrogen siloxane, dihydrogen polysiloxane, hydrogen siloxane, or hydrogen polysiloxane be bonded to the fine particles of polyvalent metal oxide, and these compounds can be dissolved in a free state in an organic solvent. Furthermore, it is not necessary that all fine particles of polyvalent metal oxide with hydroxyl groups be bonded to the dihydrogen siloxane, dihydrogen polysiloxane, hydrogen siloxane, or hydrogen polysiloxane, and these particles can be dispersed in a free state in an organic solvent.

The dihydrogen siloxane bonded to fine particles of polyvalent metal oxide through the SiOM bonds is represented by the following formula: $H_2SiO_{2/2}$. The hydrogen siloxane bonded to fine particles of polyvalent metal oxide through the SiOM bonds is represented by the following formula: $HSiO_{3/2}$. $H_2SiO_{2/2}$ bonded to metal atoms of fine particles of polyvalent metal oxide may be referred to as "dihydrogensiloxy groups" and $HSiO_{3/2}$ bonded to metal atoms of fine particles of polyvalent metal oxide may be referred to as "monohydrogensiloxy groups."

The dihydrogen siloxane originates from $H_2SiX_2$ (where X represents a halogen atom or an alkoxyl group with 1 to 4 carbon atoms). The hydrogen siloxane originates from $HSiX_3$ (where X represents a halogen atom or an alkoxyl group with 1 to 4 carbon atoms).

It is possible that one of oxygen atoms of formula $H_2SiO_{2/2}$ bonds to a hydrogen atom to form a hydroxyl group. It is also possible that one or two of oxygen atoms of formula $H_2SiO_{2/2}$ bonds to hydrogen atoms to form hydroxyl groups.

The dihydrogen polysiloxane may comprise oligomers, polymers, or a mixture of oligomers with polymers which are formed by hydrolysis and condensation of $H_2SiX_2$.

The hydrogen polysiloxane may comprise oligomers, polymers, or a mixture of oligomers with polymers which are formed by hydrolysis and condensation of $HSiX_3$.

Furthermore, the hydrogen polysiloxane may comprise oligomers, polymers, or a mixture of oligomers with polymers which are formed by co-hydrolysis and co-condensation of $H_2SiX_2$ and $HSiX_3$.

Moreover, the hydrogen polysiloxane may comprise oligomers, polymers, or a mixture of oligomers with polymers which are formed by subjecting either $H_2SiX_2$ or $HSiX_3$, or both, together with $SiX_4$ to co-hydrolysis and co-condensation.

The dihydrogen polysiloxane may have a linear or cyclic molecular structure. The hydrogen polysiloxane may have a branched, net-like, or a basket-like molecular structure.

As a general rule, when $H_2SiX_2$ is used as a starting material, the molecular structure is linear or cyclic. However, formation of dihydrogen polysiloxane may be accompanied by branching, whereby hydrogen polysiloxane is formed. When the starting material is $HSiX_3$, the molecular structure may be branched, net-like, or basket-like. When both silane compounds are used together, then sometimes the molecular structure is formed as a linear branched or a branched structure with a low degree of branching. Use in conjunction with $SiX_4$ results in a higher degree of branching.

There are no special restrictions with regard to the weight-average molecular weight of the dihydrogen polysiloxane and hydrogen polysiloxane provided that the weight-average molecular weight corresponds to or exceeds that of a dimer. However, it is recommended that the weight-average molecular weight ranges from 60 to 100,000. The weight-average molecular weight is determined by the method explained in paragraph [0077].

The hydrogen siloxane, hydrogen polysiloxane, dihydrogen polysiloxane, dihydrogen siloxane bonded to fine particles of polyvalent metal oxide via SiOM bonds are represented by the following average siloxane unit formula (7):

$[H_2SiO_{2/2}]_x [HSiO_{3/2}]_y [SiO_{4/2}]_z$ (where "x", "y", and "z" represent mole concentrations and where the following conditions are observed: $0 \leq x \leq 1.0$; $0 \leq y \leq 1.0$; $0 \leq z \leq 0.50$; $0.5 \leq (x+y) \leq 1.0$; $(x+y+z)=1$). However, "z" may be greater than 0.50, and (x+y) may be less than 0.50.

$[H_2SiO_{2/2}]$ represents a unit originating from $H_2SiX_2$ (where X represents a halogen atom or an alkoxyl group with 1 to 4 carbon atoms). $[HSiO_{3/2}]$ represents a unit originating from $HSiX_3$ (where X represents a halogen atom or an alkoxyl group with 1 to 4 carbon atoms), and $[SiO_{4/2}]$ is a unit originating from $SiX_4$.

Siloxane units constituting formula (7) may consist of $[H_2SiO_{2/2}]$ unit only, or $[HSiO_{3/2}]$ unit only; a combination of $[H_2SiO_{2/2}]$ unit with $[HSiO_{3/2}]$ unit; a combination of $[H_2SiO_{2/2}]$ unit with $[SiO_{4/2}]$ unit; a combination of $[HSiO_{3/2}]$ unit with $[SiO_{4/2}]$ unit; or a combination of $[H_2SiO_{2/2}]$ unit with $[HSiO_{3/2}]$ unit and $[SiO_{4/2}]$ unit.

Briefly, it should be noted that in the context of the present patent specification, the term "hydrogen polysiloxanes" means any of dihydrogen siloxane, dihydrogen polysiloxane, hydrogen siloxane, and hydrogen polysiloxane used individually or in any combination of two, three, or four with each other.

The fine particles of polyvalent metal oxide bonded to hydrogen polysiloxanes are represented by the following average unit formula (8):

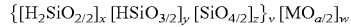

$\{[H_2SiO_{2/2}]_x [HSiO_{3/2}]_y [SiO_{4/2}]_z\}_v [MO_{a/2}]_w$ (where "x", "y", and "z" represent mole concentrations and where the following conditions are observed: $0 \leq x \leq 1.0$; $0 \leq y \leq 1.0$; $0 \leq z \leq 0.50$; $0.5 \leq (x+y) \leq 1.0$; $(x+y+z)=1$); "v" and "w" designate mass % and satisfy the following condition: $0<v<1.0$; $0<w<1.0$; $v+w=1$; M designates a polyvalent metal atom contained in the fine particles of polyvalent metal oxide; and "a" designates the valence of the polyvalent metal atom).

There are no special restrictions with regard to (v:w), i.e., the mass ratio of the hydrogen polysiloxanes to fine particles of polyvalent metal oxide in the aforementioned average unit formulas, but since the dihydrogen siloxane and hydrogen siloxane bond in the form of ornamentation on the surface of the fine polyvalent metal oxide particles, the [v:(v+w)] ratio should be low, preferably not more than 0.1.

If the amount of the used dihydrogen polysiloxane and hydrogen polysiloxane is too small, this will impair curability of the composition, and if the amount of the fine particles of polyvalent metal oxide is too small, this may reduce hardness of the cured product. Therefore, it is recommended to provide a (v:w) ratio in the range of (0.1:99.9) to (99.0:0.1), preferably in the range of (1:99) to (99:1), and most preferably, in the range of (5:95) to (90:10).

If the dihydrogen siloxane and/or hydrogen siloxane bond in the form of ornamentation to the surface of the fine polyvalent metal oxide particles, the dihydrogen polysiloxane and/or hydrogen polysiloxane should be used with the total mass percent not more than 10%, i.e., the [v:(v+w)] ratio should be not more than 0.1.

When the curable composition consists of fine particles of polyvalent metal oxide bonded to dihydrogen polysiloxane and/or hydrogen polysiloxane in combination with dihydrogen polysiloxane and/or hydrogen polysiloxane in a free state, the fine particles of polyvalent metal oxide should be used in an amount not more than 90%, i.e., the [v:(v+w)] ratio should be not more than 0.9. If the fine particles of polyvalent metal oxide are used in an amount greater than recommended, it will be difficult to provide uniformity in a cured product.

From the viewpoint of good curability, the curable composition comprising fine particles of polyvalent metal oxide bonded to dihydrogen polysiloxane and/or hydrogen polysiloxane in combination with dihydrogen polysiloxane and/or hydrogen polysiloxane in a free state is preferable.

When the hydrogen polysiloxanes contained in the fine particles of polyvalent metal oxide bonded to the hydrogen polysiloxane do not contain $[SiO_{4/2}]$ units, then it is represented by the following average siloxane unit formula (9):

$\{[H_2SiO_{2/2}]_x [HSiO_{3/2}]_y\}_v [MO_{a/2}]_w$ (where "x" and "y" represent mole concentrations and where the following conditions are observed: $0 \leq x \leq 1.0$; $0 \leq y \leq 1.0$; $(x+y)=1.0$; "v" and "w" designate mass % and satisfy the following condition: $0<v<1.0$; $0<w<1.0$; $v+w=1$; M designates a polyvalent metal atom contained in the fine particles of polyvalent metal oxide; and "a" designates a valence of the polyvalent metal atom).

If in the above-described method the silane compound of general formula (1) is added in an amount which is small relative to the fine particles of polyvalent metal oxide with hydroxyl groups (e.g., if the total mass of the hydrogen polysiloxanes does not exceed 10%), then the obtained curable liquid composition will have fine particles of polyvalent metal oxide dispersed in an organic solvent with hydrogen polysiloxanes bonded to the particle surfaces in an ornamental manner. If the silane compound is added in a larger amount (e.g., if the total mass of the hydrogen polysiloxanes exceeds 10%), the curable liquid composition will be produced in such a manner that the fine particles of polyvalent metal oxide bonded to dihydrogen polysiloxanes will be dispersed while the hydrogen polysiloxanes will be dissolved in the organic solvent. From the viewpoint of curability and properties of the cured body it is recommended that the mass ratio of the fine particles of polyvalent metal oxide bonded to hydrogen polysiloxanes to hydrogen polysiloxanes in a free state be in the range of (90:10) to (1:99), preferably (80:20) to (10:90).

There are no special restrictions with regard to the content of the fine particles of polyvalent metal oxide bonded to hydrogen polysiloxanes in the organic solvent. However, if the content is small, it will be difficult to form a uniform coating film, and if the particles are added in an excessive amount, the composition will become too viscous, and it will be difficult to form the coating. Therefore, it is recommended to add the fine particles in an amount of 5 to 50 mass %.

There are no special restrictions with regard to the average size of the fine particles of polyvalent metal oxide bonded to hydrogen polysiloxanes. If the particles are too large, this will facilitate their precipitation in the organic solvent, and if the particles are too small, they will cause manufacturing problems. Therefore, the most suitable particle size range is 5 to 100 nm. Furthermore, if the average size of the aforementioned fine particles of polyvalent metal oxide is small, the organic solvent dispersion of the fine particles of polyvalent metal oxide bonded to hydrogen polysiloxane will acquire a colloidal or sol nature.

The organic solvent suitable for the invention should be one that allows dispersion of the fine particles of polyvalent metal oxide bonded to hydrogen polysiloxanes and that does not damage hydrosilyl groups. Examples of such a solvent are the following: methanol, ethanol, isopropanol, or a similar monohydric alcohol; ethyleneglycol monomethyl ether, ethylene glycol monoethyl ether, or a similar lower dihydric alcohol, or another monoalkyl ether; toluene, xylene, or a similar aromatic hydrocarbon; and hexane, octane, or a similar lower aliphatic hydrocarbon.

It is recommended that during the reaction of condensation or hydrolysis and condensation of the silane compound of general formula (1) in the organic solvent that contains the fine particles of polyvalent metal oxide with hydroxyl groups (along with a silane compound wherein n=1 or a silane compound wherein n=2, when n=0 in the above formula) the temperature be in the range of room temperature to 50° C. Stirring and shaking of the reaction solution will improve uniformity of the reaction solution. The condensation reaction or reaction of hydrolysis and condensation is continued until complete consumption of the starting silane compound, for example, for 30 min. to 3 hours.

The curable liquid composition of the present invention is prepared by subjecting a metal halide or a metal alkoxylate represented by the following general formula (2):

$$MX_m$$

(where M represents a polyvalent metal atom, X represents a halogen atom or an alkoxyl group with 1 to 4 carbon atoms, and "m" is a valence of the polyvalent metal atom) to hydrolysis and condensation in an organic solvent and then subjecting a silane compound represented by the following general formula (1):

$$H_nSiX_{4-n}$$

(where X represents a halogen atom or an alkoxy group with 1 to 4 carbon atoms and "n" is 0, 1, or 2) (along with a silane compound wherein n=1 or a silane compound wherein n=2, when n=0 in the above formula) to a reaction of condensation, or to a reaction of hydrolysis with condensation, in the aforementioned organic solvent.

The organic solvents, metal halide or a metal alkoxylate of general formula (2), conditions of hydrolysis and condensation thereof, the silane compound of general formula (1), conditions of condensation or hydrolysis and condensation thereof are the same as described earlier for the first embodiment of the manufacturing method.

In the manufacturing methods of both embodiments, hydrolysis of the hydrogen halosilane compound of general formula (1) generates a hydrogenhalide and a hydrogen silane that has a silanol group. Furthermore, the hydrohalic acid that is added for accelerating hydrolysis of tetraalkoxysilane, hydrogen alkoxysilane, etc., acts as a catalyst for the reaction of condensation of hydrogen polysiloxanes having silanol groups and hydroxyl groups of the fine particles of polyvalent metal oxide. However, upon completion of the condensation reaction, the aforementioned hydrogenhalide and hydrohalic acid become unnecessary. Such hydrogenhalide and hydrohalic acid are preferably removed by stirring the reaction product under vacuum and by blowing dry gaseous nitrogen into the aforementioned reaction product.

Hydrolysis of the hydrogen alkoxysilane compound of general formula (1) generates an alcohol with 1 to 4 carbon atoms and a hydrogen silane that has a silanol group. Such alcohol is preferably removed in the same way.

Upon completion of the reaction, the water-soluble organic solvent, the silane compound of general formula (1), and the alcohol and hydrohalic acid (e.g., hydrochloric acid) generated as byproducts in hydrolysis of the alkoxylated polyvalent metal or polyvalent metal halide of formula (2) are removed from the system, whereby a curable liquid composition free of impurities and unnecessary components is obtained. If necessary, the product is subjected to additional treatment such as concentration, organic solvent exchange, etc. For example, if the reaction system contains a non-polar organic solvent in the form of toluene and a water-soluble organic solvent in the form of ethanol and methanol, then upon completion of the reaction the ethanol and methanol can be removed by evaporation, and a toluene dispersion of fine particles of metal oxide bonded to hydrogen polysiloxanes is obtained by adding an appropriate amount of toluene.

However, hydrogen polysiloxanes in a free state may coexist in a mixture with unreacted fine particles of polyvalent metal oxide.

Normally, the organic solvent dispersion of the fine particles of polyvalent metal oxide bonded to hydrogen polysiloxanes is more viscous than the organic solvent dispersion of fine particles of polyvalent metal oxide with hydroxyl groups which constitute the starting material.

Removal of the organic solvent from the aforementioned organic solvent dispersion produces fine particles of polyvalent metal oxide bonded to hydrogen polysiloxanes. However, the particles may be obtained in a mixture with hydrogen polysiloxanes in a free state and unreacted fine particles of polyvalent metal oxide.

The fine particles of polyvalent metal oxide bonded to hydrogen polysiloxanes that constitute the main component of the curable liquid composition of the present invention may be selected from fine particles of silica, titanium oxide, zirconium oxide, alumina oxide, tin oxide, and zinc oxide, as well as from composite fine particles of silica and titanium oxide, composite fine particles of silica and zirconium oxide, or composite fine particles of silica and alumina. Most preferable from the viewpoint of storage stability, properties of the composition and properties of cured bodies are composite fine particles of silica and titanium oxide, composite fine particles of silica and zirconium oxide, and composite fine particles of silica and alumina.

When the hydrogen polysiloxanes contained in fine polyvalent metal oxide particles bonded to hydrogen polysiloxanes that constitute the main component of the curable liquid composition of the present invention and the hydrogen polysiloxanes contained in a free state are heated in an oxygen-containing atmosphere at a temperature of higher than 150° C., under the effect of the reaction of oxidation, hydrogen atoms bonded to silicon atoms are turned into hydroxyl groups, whereby the hydroxyl groups and silicon-bonded hydrogen atoms are subjected to a dehydration and condensation reaction that causes cross-linking through SiOSi bonds and curing.

Instead of heating in an oxygen-containing atmosphere, heating can be carried out in pure inert gas under vacuum at a temperature of 200° C. or higher which may cause re-arrangement of molecules with the resulting cross-linking and curing. It is recommended that curing temperature be higher than 200° C. and preferable in the range of 200 to 450° C. Duration of heating at a temperature of 200° C. is 10 hours or longer. The higher is the temperature, the shorter is the heating time.

Instead of heating in the oxygen-containing atmosphere, curing can be carried out by exposure to ozone, to nitrous oxide gas, or to wet ammonia gas.

The curing reaction can be induced even with ozone and in this case will proceed with higher efficiency than a reaction induced by oxygen gas in air. When the reaction is carried out in wet ammonia, the silicon-bonded hydrogen is activated and can easily react with water contained in air, thus forming a hydroxyl group, whereby the hydroxyl group and silicon-bonded hydrogen atom are subjected to a dehydration and condensation reaction to cross-link. As a result, a silica (silicon oxide)-type cured body is formed.

Furthermore, there is no need to consume all silicon-bonded hydrogen atoms contained in hydrogen polysiloxanes bonded to fine particles of polyvalent metal oxide or in hydrogen polysiloxanes that exist in a free state, and a part, e.g., less than 60 mole % of these atoms may remain. By increasing the degree of consumption of silicon-bonded hydrogen atoms, i.e., by increasing, due to formation of SiOSi bonds, hardness of the obtained silica-type cured body, it becomes possible to obtain pencil hardness in the range of 4H to 10H, preferably 5H to 9H.

A typical example of the oxygen-containing atmosphere is air. Other examples are helium, argon, and nitrogen with oxygen in concentrations lower than in air. It is recommended that heating temperature be higher than 150° C., preferably higher than 180° C., and most preferably in the range of 180 to 450° C. Duration of heating at a temperature of 200° C. is 10 hours or longer. The higher is the temperature, the shorter is the heating time. Ozone may be represented by purified ozone, ozone-containing air, steam-containing ozone, or ozone-containing nitrogen gas. Any of these gases can be used. Nitrous oxide can be represented by pure gaseous nitrous oxide, nitrous-oxide-containing air, and nitrous-oxide containing nitrogen. Any of these gases also can be used. Gaseous wet ammonia can be exemplified by ammonia-containing air, ammonium hydroxide, and nitrogen gas that contains ammonia and steam. Exposure to the atmosphere of ozone, nitrous oxide, and wet ammonia may also be carried out with heating.

The aforementioned hydrogen polysiloxanes bonded to fine particles of polyvalent metal oxide or hydrogen polysiloxanes that exist in a free state may also be cured by irradiating with a high-energy beam. An example is irradiation with X-ray or an electron beam. It is recommended that amount of radiation be in the range of 0.5 MGy to 10 MGy.

A silica-type cured body can be produced by pouring into a mold a curable liquid composition from which the organic solvent has been removed and consists of fine particles of silica bonded to hydrogen polysiloxane and hydrogen polysiloxanes, if necessary, maintaining the composition in an uncured state at a temperature not exceeding 120° C. for improving flowability, curing the composition, forming a silica-type molded body by heating the composition at a temperature above 150° C., or by irradiating the composition with high-energy beams, and then extracting the silica-type molded body from the mold.

There are no special restrictions with regard to the shape of the silica-type molded body, and it can be made in the form of a film, slab, sheet, strips, triangular rods, rectangular rods, cubes, cuboids, cylinders, spheres, elliptic spheres spherical bodies, convex lenses, concave lenses, prisms, seals of UV light sources, or glass enclosures for lamps.

The curable liquid composition which comprises fine particles of silica bonded to hydrogen polysiloxane and hydrogen polysiloxanes in a free state can be easily poured into a mold at room temperature. If at room temperature the composition is highly viscous or solid, in order to enhance flowability, the composition can be maintained in an uncured state at a temperature not exceeding 120° C. The mold can be made from metal, plastic, or ceramic, provided that it possesses mold-release properties with regard to the silica-type glass. Mold interior can have various shapes complying with the shape of a silica-type cured body which is a molded product, specifically optical elements.

Since tightness of contact of the composition with the mold surface is important for accurate reproduction of the mold shape, prior to curing it is necessary to take into account such factors as thermal expansion and curing shrinkage, as well as thermal shrinkage after curing. When the aforementioned curable composition is poured or injected into the mold at room temperature or at a temperature close to room temperature and is then heated above 120° C., at the coefficient of thermal expansion of 100 to 150 ppm, expansion may reach several percent. On the other hand, the condensation-reaction curing causes shrinkage of about 5% or more. Therefore, volumetric changes caused by thermal expansion and curing shrinkage cannot be easily compensated. For this reason, it is recommended to perform curing under pressure.

In order to obtain a molded product with good optical properties, it is necessary to perform curing without generation of strains. It is recommended to use a curable composition which does not exceed 10,000 mPa·s, and preferably is below 5,000 mPa·s at the initial curing temperature of less than 120° C.

Molding with a mold is exemplified by compression molding, injection molding, transfer molding, casting, or dipping. Curing by heating is appropriate for compression molding, injection molding, and transfer-molding curing, while curing by irradiation with a high energy ray is more appropriate for casting and dipping.

The silica-type molded body prepared by the above method is transparent, is free of cracks and inner strains, has pencil hardness of 4H to 9H (in units specified by paragraph 8.4.2 of JIS K 5400), possesses appropriate elasticity, has optical transmittance of 90 to 100% in the range from vacuum UV light to UV light with 200 nm or higher wavelength, i.e., in the range from 200 to 400 nm, and has optical transmittance of 90% or higher in the range from visible light to near-infrared light with wavelength below 1700 nm, e.g., in the range from 400 to 1700 nm, such a molded body is suitable for use as a material for optical application.

Within the limits measured by an ellipsometer, the thus obtained silica-type moldings exhibit no birefringence, and roughness thereof, as measured by Atomic Force Microscopy (AFM), is not more than 12 nm, which makes it possible to achieve a precision of about $\frac{1}{10}\lambda$ at least at 200 nm and excellent transfer of the inner surface shape of the mold used for molding.

Furthermore, the moldings are useful as materials for optical elements exposed to elevated temperatures because they have a coefficient of linear expansion of about 120 ppm and possess durability at temperatures in the vicinity of 400° C.

Lenses, mirrors, prisms, seals, diffraction gratings, and glass enclosures for lamps are representative of optical elements made of such silica glass.

The lenses are exemplified by convex lenses, concave lenses, diffraction lenses, light-diffusing lenses, and light beam condensing lenses. The light that passes through the optical elements is exemplified by vacuum-UV light, far-UV light, UV light, excimer laser light, solid-state laser light, YAG laser light, and visible light.

Optical elements having a silica-type layer which is colorless, transparent, cracking- and internal stress-free, has a pencil hardness of 4H to 9H (in units according to paragraph 8.4.2 of JIS K 5400), an optical transmittance of 90% or higher in the region from vacuum-UV light to UV light at 200 nm or higher wavelength, and optical transmittance higher than 90% in the range from visible light to near infra-red light of 1700 nm or lower can be produced by a process, in which the curable composition that consists of fine silica powders bonded to hydrogen polysiloxane and hydrogen polysiloxane in a free state and that, if necessary, is made more flowable by maintaining this composition at a temperature below 120° C., is coated on an optical member with an optical transmittance of 90% or higher, and is then cured, e.g., by heating at a temperature of not less than 150° C. under an oxygen-containing atmosphere, by heating in inert gas, or in vacuum at a temperature no less than 200° C., by high-energy irradiation, by exposure to ozone, by exposure to nitrous oxide, or by exposure to wet ammonia.

Optical members of synthetic quartz, natural quartz, and fluorite are representative examples of optical members with an optical transmittance of 90% or higher in the vacuum-UV to UV region and an optical transmittance of 90% or higher in the visible region to near infrared region.

It is preferable to use the curable liquid composition of the present invention for coating after dilution with an organic solvent, if it has a higher viscosity. In particular, dilution with a solvent is preferred when forming a silica glass thin film with a film thickness on the order of several microns. The solvents are exemplified by toluene, xylene, benzene, and other aromatic hydrocarbons; cyclohexane, hexane, octane, decane, and other aliphatic hydrocarbons; dichloromethane, chloroform, and other halogen-containing hydrocarbons; methyl ethyl ketone, methyl isobutyl ketone, and other aliphatic ketones; butyl ether, tetrahydrofuran, and other ethers.

The concentration of the fine silica particles bonded to hydrogen polysiloxane or concentration of fine silica particles bonded to hydrogen polysiloxane together with hydrogen polysiloxane in a free state should be sufficient to form thin films of silica with a film thickness on the order of several microns by lowering their viscosity or dissolving them, i.e., for instance, from 10 to 60 mass %, and, more preferably, from 10 to 50 mass %.

There are no special restrictions with regard to the method of coating, which is exemplified by spin coating, blade coating, spray and roller coating, and dip coating. The thickness of the silica films may vary from 1 µm to 10 µm and up to about 1 mm.

The thus obtained optical members with a silica-type coating are useful as optical elements because they exhibit no cracking or internal strain, have a pencil hardness of 4H to 9H (in units specified by paragraph 8.4.2 of JIS K5400), and possess an optical transmittance of 90% or higher in the vacuum-UV region to UV region at 200 nm, i.e. 200 to 400 nm, and an optical transmittance of 90% or higher in the visible region to near infrared region up to 1700 nm, i.e. 400 to 1700 nm. Additionally, while the thus obtained optical elements with a thin silica-type layer have some limitations with regard to sputtering film-forming substances used for antireflective films due to the presence of reducing properties, the antireflective films can be formed in the same manner as the glass.

Furthermore, the moldings of the invention are useful as materials for optical elements exposed to elevated temperatures because they have a coefficient of linear expansion of about 120 ppm and possess durability at temperatures in the vicinity of 400° C.

Lenses, mirrors, prisms, diffraction gratings, sealing elements, glass enclosures for lamps, and light-guides are representative of the thus obtained optical elements having a silica film layer, which are cracking- and internal strain-free, have a pencil hardness of 4H to 9H (in units specified by paragraph 8.4.2 of JIS K 5400), and possess an optical transmittance of 90% or higher in the vacuum-UV region to UV region at 200 nm, and an optical transmittance of 90% or higher in the visible region to near infrared region up to 1700 nm.

The lenses are exemplified by convex lenses, concave lenses, diffraction lenses, light-diffusing lenses, and light beam condensing lenses. The light that passes through the optical elements is exemplified by vacuum-UV light of 170 nm or higher, far-UV light, UV light, excimer laser light, solid-state laser light, YAG laser light, visible light, and near infrared light of up to 1700 nm.

An inorganic substrate with a silica-type layer which is smooth, free of cracks, resistant to heat, possesses electric insulating properties, has excellent flexibility, pencil hardness of 4H to 9H, and preferably 7H to 9H, is obtained by applying the curable liquid composition of the present invention onto an inorganic substrate and then curing the coating, e.g., by heating at a temperature of not less than 150° C. under an oxygen-containing atmosphere, by heating in inert gas, or in vacuum at a temperature no less than 200° C., by high-energy irradiation, by exposure to ozone, by exposure to nitrous oxide, or by exposure to wet ammonia.

The inorganic substrate for the formation of a silica-type layer should withstand a temperature of 350° C. or higher, preferably 500° C. or higher, and most preferably, 700° C. or higher. The inorganic substrate should be durable and possess mechanical strength sufficient to withstand mechanical surface treatment, and stress and deformations that may occur in use. Typical examples of inorganic substrates are metal plates, ceramic plates, non-optical glass plates, and semiconductor chips. Inorganic substrates such as metal plates, ceramic plates, and inorganic glass plates may be sufficiently thick and non-flexible or thin and flexible. However, thin and flexible substrates are required for application of thin semiconductor elements and devices such as thin-film solar batteries, thin-film transistors (TFT) used in reflection-type liquid crystal displays, and devices and elements used in thin-film electroluminescent displays.

Metal plates and metal foils are preferable from the point of view of high mechanical strength. The following are specific examples of metals suitable for such purpose: gold, silver, copper, nickel, titanium, titanium alloys, aluminum, zirconium, steel, in particular, stainless steel, molybdenum steel, etc. The stainless steel foil can be exemplified by ferrite-type stainless steel foil, martensite stainless steel foil, and austenite stainless steel foil. Glass thin sheets are preferable from the view of transparency.

A thin plate suitable for use as an inorganic substrate should have a thickness between 10 µm and 1 mm, preferably between 20 µm and 200 µm. The thinner the substrate, the higher its flexibility. However, if it is thinner than 10 µm, it becomes inconvenient for handling in view of its extreme flexibility. On the other hand, if the thickness of the substrate exceeds 200 µm, it becomes inflexible and unsuitable for use in thin-film semiconductor devices such as thin-film solar batteries.

There are no special restrictions with regard to the method for application of a coating of the aforementioned curable liquid composition of the present invention.

This may be spin coating, blade coating, spraying, roller coating, or coating by dipping. The silica-type layer formed and cured on the aforementioned substrate by using fine particles of polyvalent metal oxide (in particular, fine silica particles) bonded mainly to hydrogen polysiloxanes and the silica layer formed and cured on the aforementioned substrate by using fine particles of polyvalent metal oxide (in particular, fine silica particles) bonded to hydrogen polysiloxanes in combination with hydrogen polysiloxane in a free state normally has a thickness within the range of 0.1 µm to 10 µm. For those cases that do not require special flexibility, the thickness may exceed 10 µm, and in extreme cases may be as high as 1 mm.

In a majority of cases, the silica-type layer is formed on one side of an inorganic substrate, but if necessary on both sides of the inorganic substrate. In case of applying a coating on both sides of the substrate, the curable liquid composition of the present invention is applied first on one side of the substrate by spin coating, blade coating, spraying, or roller coating. The applied layer is cured by heating, and then the coating agent of the present invention is applied on the other side of the substrate by spin coating, blade coating, spraying, or roller coating. Alternatively, the inorganic substrate is dipped into the curable liquid composition of the present invention, and then the coating layer is cured by heating. According to still another method, the curable liquid composition of the present invention is applied on both surfaces of the inorganic substrate by spraying with subsequent curing of the applied composition by heating.

An inorganic substrate having a silica-type coating with a pencil hardness of 4H to 9H, and preferably of 7H to 9H, that comprises a cured body obtained from the curable composition consisting of fine particles (in particular, fine silica particles) of polyvalent metal oxide bonded mainly to hydrogen polysiloxanes or from the curable composition consisting of fine particles (in particular, fine silica particles) of polyvalent metal oxide bonded to hydrogen polysiloxanes in combination with hydrogen polysiloxanes in a free state, has a smooth surface formed by the aforementioned coating method with flatness not exceeding 10 nm, where the silica-type layer is characterized by excellent resistance to heat, resistance to frost, electrical insulating properties, mechanical strength, and resistance to chemicals and is suitable for use in devices such as thin-film solar batteries, reflection-type liquid crystal displays, and electroluminescent displays.

When the inorganic substrate is flexible, it is suitable for use as a substrate for devices such as thin-film solar batteries, thin-film transistors (TFT) used in reflection-type liquid crystal displays, devices and elements used in thin-film electroluminescent displays, and as a substrate for electrodes in thin-film-type lithium batteries. When the inorganic substrate is a thin glass substrate, it is also suitable for use in manufacturing of thin-film solar batteries, thin-film transistors (TFT) used in transmissive liquid crystal displays, and devices and elements used in thin-film electroluminescent displays.

A thin-film solar battery is produced by forming on the surface of a thin flexible plate a first thin-film electrode that comprises a cured body of the aforementioned curable composition with a pencil hardness of 4H to 9H, preferably of 7H to 9H, forming a silicon semiconductor layer on the aforementioned first thin-film electrode, and then forming a second thin-film electrode on top of the aforementioned silicon semiconductor layer. Alternatively, a thin-film solar battery is produced by forming on the surface of a thin flexible plate a first thin-film electrode that comprises a cured body of the aforementioned curable composition with a pencil hardness of 4H to 9H, forming a compound semiconductor layer on the aforementioned first thin-film electrode, and then heat-treating the compound semiconductor layer.

A thin-film transistor can be produced by forming an amorphous-silicon-semiconductor layer on the surface of a thin flexible metal plate having a silica-type layer that comprises a cured body of the aforementioned curable composition with a pencil hardness of 4H to 9H, preferably, 7H to 9H, and then conducting heat treatment.

A thin-film electroluminescent (EL) element can be produced by forming a silicon-containing conductive electrode layer on the surface of a thin flexible metal plate having a silica-type layer that comprises a cured body of the aforementioned curable composition with a pencil hardness of 4H to 9H, preferably 7H to 9H, forming an electrically insulating layer on the aforementioned silicon-containing conductive electrode layer, forming a light-emitting layer on the aforementioned electrically insulating layer, and, finally, conducting heat treatment.

Moreover, a positive electrode material of a lithium solar battery can be produced by forming a positive electrodes layer of a manganese oxide, $LiMn_2O_4$, or the like, on the surface of a thin flexible metal plate having a silica-type layer that comprises a cured body of the aforementioned curable composition with a pencil hardness of 4H to 9H, preferably 7H to 9H.

The manufacture involves a high-temperature processes such as vapor disposition, plasma CVD, spattering, high-temperature heat treatment, etc. Therefore, the flexible thin metal substrate will be exposed to temperatures from 400 to 700° C., but because the coating on the substrate is made from a cured body of the aforementioned curable composition with a pencil hardness of 4H to 9H, preferably 7H to 9H, it will not be subject to change of properties, deterioration of properties, or deformations.

A thin-film semiconductor device, such as a thin-film solar battery, normally can be produced by forming a layer of metal, e.g., molybdenum, on a thin metal substrate, forming a thin-film electrode layer, e.g., by photo-etching, coating a semiconductor on the thin film electrode layer, and finally forming a thin-film semiconductor layer by photo-etching or laser scribing. The final process may comprise coating of the thin-film semiconductor layer with a transparent conductive film with subsequent formation of a thin-film electrode layer by photo-etching. For this purpose, the thin metal substrate should possess resistance to chemicals and corrosion.

Since a thin-film type solar battery is used in applications requiring high flexibility, the thin metal substrate utilized in such a device should possess flexibility. The material suitable for this purpose from the point of view of good thermal conductivity, resistance to chemicals and corrosion may be selected from stainless steel, molybdenum steel, alumina, etc. Stainless steel can be recommended as the material that, in addition to the above-mentioned characteristics, is advantageous in view of its availability and low cost. The most suitable from these points of view is stainless steel foil. The stainless steel foil can be exemplified by a ferrite-type stainless steel foil, martensite stainless steel foil, and austenite stainless steel foil.

There are no special restrictions with regard to the type of metal from which a metal electrode can be made on the surface of the silica-type layer that has a pencil hardness of 4H to 9H, preferably 7H to 9H, and comprises a cured body of the aforementioned curable composition. For example, this can be molybdenum, aluminum, gold, silver, copper, iron, tin, etc., or alloys of the above.

Semiconductors suitable for forming semiconductor layers on the surfaces of metal electrodes may comprise polycrystalline silicon semiconductors, single-crystal semiconductors, amorphous silicon semiconductors, or compound semiconductors. Examples of compound semiconductors are CIS, CdTe, and GICS. Transparent electrodes formed on such semiconductor layers can be made from an alloy of indium oxide and tin, tin oxide, indium oxide, and zinc oxide. If necessary, the transparent electrodes can be coated with protective layers. Materials most suitable for the protective layers are high polymers such as fluoro resin, transparent polyimide, or similar materials with high light transmittance and weather-proof properties.

Thin-film solar batteries produced by the above-described method have flexible substrates that can be bent without forming cracks during production or handling, wherein the thin silicon-type layers are not subject either to formation of cracks or separation from the stainless steel foil. Therefore, such thin-film solar batteries have excellent productivity=excellent handling properties, and excellent durability. This applies not only to thin-film solar batteries but also to thin-film transistors (TFT) of reflection-type liquid crystal displays, and thin-film semiconductor devices or elements of thin-film electroluminescent displays, thin-film lithium batteries, etc.

EXAMPLES

The invention will be further described more specifically with reference to practical examples and comparative examples, which, however, should not be construed as limiting the scope of the invention application.

If not specified, all processes of dissolving, stirring, coating, heating, as well as measurement procedures described in the application and comparative examples are carried out in the environment of a test laboratory.

Characteristics used in reference examples were measured under conditions described below.

Viscosity of toluene dispersions and curable liquid compositions was measured by means of an E-model rotary-type viscometer of Tokimec Inc. at 25° C.

Weight-average molecular weights and molecular weight distributions of fine particles of polyvalent metal oxide bonded to hydrogen polysiloxanes contained in the composition as well as of the aforementioned particles contains in the composition in combination with free hydrogen polysiloxanes were measured with the use of gel permeation chromatography (GPC). The instruments used for this purpose comprised a refractometer of HLC-8020 gel permeation (GPC) instrument of Tosoh Corporation and a two-column unit TSKgel $GMH_{XL}$-L of Tosoh Corporation. The sample materials were tested with the use of a 2 wt % chloroform solution. Calibration curves were plotted based on polystyrene as a reference with a known molecular weight. All weight-average molecular weights were determined with reference to a polystyrene standard.

$^{29}$Si-NMR and $^1$H-NMR spectra of fine particles of polyvalent metal oxide bonded to hydrogen polysiloxanes contained in the composition as well as of the aforementioned particles contained in the composition in combination with free hydrogen polysiloxanes were measured with the use of a Bruker ACP-300 Spectrometer.

The presence of silanol groups and hydroxyl groups (absorption frequency of 3200 to 3800 $cm^{-1}$) as well as of silicon-bonded hydrogen (absorption frequency of 2264 $cm^{-1}$ for $SiH_2$ groups and 2260 $cm^{-1}$ for SiH groups) was detected via FT-IR spectra. The FT-IR spectra were measured with the use of Nicolet Protégé 460 Spectrometer.

The average size of fine silica particles, such as fine particles of polyvalent metal oxide, was measured by a dynamic light scattering method with the use of MICROTRAC UPA-150 of Nikkiso Co., Ltd.

A solid content of the curable liquid compositions was determined by placing on a stainless-steel Petri dish 1 g of precisely weighted sample, drying the sample overnight in air at room temperature, retaining the sample for 3 hours in a thermostat at 120° C., and obtaining the solid substance as the residue.

Pencil hardness of the thin silica-type layers was measured by scratching the surfaces of the films with pencils of different hardness in accordance with paragraph 8.4.2 of JIS K5400, and determining the maximum hardness (concentration signal) that did not produce scratches.

Presence of cracks in the thin silica-type layers was observed with the use of a KEYENCE VH-7000 electron microscope.

Surface roughness of thin silica-type layers was measured with 25 μm scan by using an AFM-DI 5000 Atomic Force Microscope (hereinafter referred to as AFM).

The thickness of the thin silica-type layer was measured in a cross section of the samples with the use of FESEM-JEOL JSM-6335F Field Emission Scanning Electron Microscope.

Example 1

A glass-made reactor vessel equipped with a stirrer, a nitrogen-supply tube, condenser, thermometer, and injection port was filled with 65 g of a water-soluble solvent in the form of ethanol, 65 g of a non-polar solvent in the form of toluene, 3.5 g (0.198 mole) of water, and 0.20 g of a hydrolysis catalyst in the form of a 35% aqueous solution of a hydrochloric acid (with 0.128 g (0.070 mole) of water). The components were vigorously stirred for 10 min. at room temperature, whereby a homogeneous liquid was obtained. Following this, 20.8 g (0.10 mole) of tetraethoxysilane were added, the mixture was stirred for 1 hour at 30° C., whereby a reaction of hydrolysis and condensation was conducted. The reaction product was combined with 10 g of butyl alcohol, and the ethanol was removed by heating. Toluene was added simultaneously with removal of butanol. As a result, a toluene dispersion of fine silica particles having silanol groups was prepared. The resultant toluene dispersion was cooled to a temperature below 5° C., 10 ml of a toluene solution that contained 2.02 g (0.02 mole) of dihydrogen dichlorisilane were added during 1 hour, the resultant mixture was stirred for 2 hour, whereby a reaction of hydrolysis and condensation was performed. Following this, 65 g of toluene were added to the resultant reaction product, and after removal of hydrochloric acid, ethanol and butyl alcohol together with a part of toluene in vacuum and at a temperature below 40° C., a toluene dispersion of the reacted fine silica particles was obtained (15 mass % concentration of $SiO_2$, 3.5 mPa·s viscosity at 25° C., and 21 nm of particle size measured by dynamic light scattering). A portion of the toluene dispersion of the reacted fine silica particles was sealed in a plastic container, stored for 1 month in a refrigerator at 5° C., and then a viscosity of the stored toluene dispersion was measured showing 3.8 mPa·s.

From the integrated value of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this toluene dispersion, it was confirmed that the dried residue of this toluene dispersion, i.e., reacted fine silica particles, had the average unit formula:

$(H_2SiO_{2/2})_{0.10}(HSiO_{3/2})_{0.05}(SiO_2)_{0.85}$.

The $HSiO_{3/2}$ units were included due to branching of the dihydrogen polysiloxane chain.

FT-IR measurements of the reacted solid fine silica particles obtained from the aforementioned toluene dispersion of the reacted fine silica particles showed absorption peaks at 2264 $cm^{-1}$ and 2200 $cm^{-1}$ originating from silicon-bonded hydrogen atoms ($SiH_2$ groups and SiH groups). However, the absorption peak originating from silanol groups had about 50% lower intensity as compared to those peaks of the fine silica particles prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene and fine silica particles bonded to hydrogen polysiloxane and dihydrogen polysiloxane.

Example 2

A reaction was carried out in the same manner as in Example 1, except that 10.0 ml of a toluene solution containing 1.01 g (0.010 mole) of dihydrogen dichlorosilane and 2.03 g (0.015 mole) of hydrogen trichlorosilane (in a mole ratio of 2:3) instead of 10 ml of the toluene solution containing 2.02 g (0.02 mole) of dihydrogen dichlorosilane were loaded into the toluene dispersion of fine silica particles having silanol groups obtained by hydrolysis and condensation of tetraethoxysilane, were stirred at room temperature, and caused to react. The reaction solution was combined with 10 ml of isopropyl alcohol, hydrochloric acid, ethanol and isopropyl alcohol were removed under temperature below 40° C. in vacuum, and as a result, a toluene dispersion of fine silica particles was obtained (20 mass % concentration of $SiO_2$, 1.160 specific gravity at 20° C., 3.8 mPa·s viscosity at 20° C., and 31 nm of particle size measured by dynamic light scattering). A portion of the toluene dispersion of the reacted fine silica particles was sealed in a plastic container, stored for 1 month in a refrigerator at 5° C., and then a viscosity of the stored toluene dispersion was measured showing 3.9 mPa·s.

From the integrated values of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this toluene dispersion, it was confirmed that the dried residue of this toluene dispersion, i.e., reacted fine silica particles, had the average unit formula: $(H_2SiO_{2/2})_{0.05}(HSiO_{3/2})_{0.13}(SiO_2)_{0.82}$.

FT-IR measurements of the reacted solid fine silica particles obtained from the aforementioned toluene dispersion of the reacted fine silica particles showed absorption peaks at 2264 cm$^{-1}$ and 2200 cm$^{-1}$ originating from silicon-bonded hydrogen atoms ($SiH_2$ groups and SiH groups). However, the absorption peaks originating from silanol groups had about 50% lower intensity as compared to those peaks of the fine silica particles prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene and fine silica particles bonded to hydrogen polysiloxane and dihydrogen polysiloxane.

Example 3

A reaction was carried out in the same manner as in Example 1, except for increasing the amount of dihydrogen dichlorisilane from 2.02 g (0.020 mole) to 8.08 g (0.080 mole), whereby a liquid composition (with 15 mass % concentration of solids and 5.0 mPa·s viscosity at 25° C.) containing fine reacted silica particles dispersed in toluene and dihydrogen polysiloxane and hydrogen polysiloxane dissolved in toluene was obtained. A portion of the obtained colloidal-type liquid composition was sealed in a plastic container, stored for 1 month in a thermostat at 5° C., and then a viscosity was measured showing 3.8 mPa·s.

From the integrated value of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this liquid composition, it was confirmed that the dried residue of this liquid composition had the average unit formula:

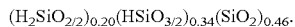

$(H_2SiO_{2/2})_{0.20}(HSiO_{3/2})_{0.34}(SiO_2)_{0.46}$.

The $HSiO_{3/2}$ units were included due to branching of dihydrogen polysiloxane chain.

FT-IR measurements of the reacted solid fine silica particles obtained from the liquid composition showed absorption peaks at 2264 cm$^{-1}$ and 2200 cm$^{-1}$ originating from silicon-bonded hydrogen atoms ($SiH_2$ groups and SiH groups). However, the absorption peaks originating from silanol groups had about 50% lower intensity as compared to those peaks of the fine silica particles prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene, fine silica particles bonded to hydrogen polysiloxane and dihydrogen polysiloxane, as well as of hydrogen polysiloxane and dihydrogen polysiloxane in a free state.

Example 4

A reaction was carried out in the same manner as in Example 2, except that a mixture of 8.08 g (0.08 mole) of dihydrogen chlorosilane and 32.52 (0.24 mole) of hydrogen trichlorosilane was used instead 1.01 g (0.010 mole) of dihydrogen chlorosilane and 2.03 g (0.015 mole) of hydrogen trichlorosilane, whereby a liquid composition (with 15 mass % concentration of solids and 5.0 mPa·s viscosity at 25° C.) containing fine reacted silica particles dispersed in toluene and hydrogen polysiloxane resin dissolved in toluene was obtained From the integrated values of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this liquid composition, it was confirmed that the dried residue of this liquid composition had the average unit formula:

$(H_2SiO_{2/2})_{0.15}(HSiO_{3/2})_{0.62}(SiO_2)_{0.2}$.

FT-IR measurements of the reacted fine silica particles obtained from the aforementioned colloidal liquid composition showed absorption peaks at 2264 cm$^{-1}$ and 2200 cm$^{-1}$ originating from silicon-bonded hydrogen atoms ($SiH_2$ groups and SiH groups). However, the absorption peaks originating from silanol groups had about 50% lower intensity as compared to those peaks of the fine silica particles prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion comprised a curable liquid composition consisting mainly of toluene, fine silica particles bonded to hydrogen polysiloxane and dihydrogen polysiloxane, as well as of hydrogen polysiloxane resin in a free state.

Example 5

A reactor vessel equipped with a stirrer, a nitrogen-supply tube, and thermometer was filled with 65 g of a water-soluble solvent in the form of methanol, 65 g of a non-polar solvent in the form of toluene, 3.5 g (0.198 mole) of water, and 0.20 g of a hydrolysis catalyst in the form of a 35% aqueous solution of a hydrochloric acid (with 0.128 g (0.070 mole) of water).

The components were vigorously stirred for 10 min. at room temperature, whereby a homogeneous liquid was obtained. Following this, 15.2 g (0.10 mole) of tetramethoxysilane were added, the mixture was stirred for 1 hour at 30° C., 10 ml of a toluene solution containing 2.40 g (0.020 mole) of dihydrogen diethoxysilane were added, the mixture was stirred for 2 hours, whereby a reaction of hydrolysis and condensation was conducted. Next, 10 ml of isopropyl alcohol were added during one hour, and while adding toluene, the ethanol, methanol, and isopropyl alcohol were removed together with a part of toluene under vacuum at a temperature not exceeding 40° C. As a result, a toluene dispersion of fine reacted silica particles was obtained (15 mass % concentration of $SiO_2$, 3.5 mPa·s viscosity at 20° C., and 25 nm of particle size measured by dynamic light scattering). A portion of the obtained colloidal toluene dispersion was sealed in a plastic container, stored for 1 month in a refrigerator at 5° C., and then the viscosity of the stored toluene dispersion was measured showing 3.8 mPa·s.

From the integrated values of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this colloidal toluene dispersion, it was confirmed that the dried residue of this toluene dispersion, i.e., reacted fine silica particles, had the average unit formula:

$$(H_2SiO_{2/2})_{0.12}(HSiO_{3/2})_{0.05}(SiO_2)_{0.83}.$$

The $HSiO_{3/2}$ units were included due to branching of dihydrogen polysiloxane chain.

FT-IR measurements of the reacted solid fine silica particles obtained from the aforementioned toluene dispersion showed absorption peaks at 2264 cm$^{-1}$ and 2200 cm$^{-1}$ originating from silicon-bonded hydrogen atoms ($SiH_2$ groups and SiH groups). However, the absorption peaks originating from silanol groups had about 50% lower intensity as compared to those peaks of the fine silica particles prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene and fine silica particles bonded to hydrogen polysiloxane and dihydrogen polysiloxane.

Example 6

A toluene dispersion of reacted fine silica particles (with 20 mass % concentration of $SiO_2$, specific gravity of 1,160 at 20° C., 3.8 mPa·s viscosity at 20° C., 0.5 mass % concentration of isopropyl alcohol, and 35 nm size of particles determined by the dynamic light scattering method) was obtained by the same method as in Example 5, except that a mixture of 0.96 g (0.008 mole) of dihydrogen diethoxysilane and 1.96 g of hydrogen triethoxysilane (0.012 mole) in a mole ratio of 2:3 was used instead 2.40 g (0.020 mole) of dihydrogen diethoxysilane.

A portion of the resultant colloidal toluene dispersion was sealed in a plastic container, stored for 1 month in a thermostat at 5° C., and then the viscosity of the stored toluene dispersion was measured showing 3.9 mPa·s.

From the integrated values of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this toluene dispersion, it was confirmed that the dried residue of this toluene dispersion, i.e., reacted fine silica particles, had the average unit formula:

$$(H_2SiO_{2/2})_{0.03}(HSiO_{3/2})_{0.17}(SiO_2)_{0.80}.$$

FT-IR measurements of the reacted fine silica particles showed absorption peaks at 2264 cm$^{-1}$ and 2200 cm$^{-1}$ originating from silicon-bonded hydrogen atoms ($SiH_2$ groups and SiH groups). However, the absorption peaks originating from silanol groups had about 50% lower intensity as compared to those peaks prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene and fine silica particles bonded to hydrogen polysiloxane and dihydrogen polysiloxane.

Example 7

A homogeneous liquid was obtained by vigorously stirring 65.0 g of ethanol, 15.0 g of toluene, and 3.60 g of water for 10 min. at room temperature in the same reactor that was used in Example 1. The liquid was then compounded with 16.6 g (0.080 mole) of tetraethoxysilane, stirred for 1 hour at 30° C., combined with 4.08 g (0.02 mole) of triisopropoxy aluminum, and stirred for 1 hour at 30° C. Following this, 2.02 g (0.020 mole) of dihydrogen dichlorosilane were added, the mixture was stirred for 2 hours and at 30° C., and a reaction of hydrolysis and condensation was conducted. Hydrochloric acid, ethanol and isopropanol together with a part of toluene were then removed, whereby a toluene dispersion of reacted fine composite particles of silica and alumina was obtained (with 15 mass % concentration of solids, 3.5 mPa·s viscosity at 25° C., and 21 nm particle size determined by a dynamic light scattering method). A portion of the obtained colloidal toluene dispersion was sealed in a plastic container, stored for 1 month in a thermostat at 5° C., and then the viscosity of the stored toluene dispersion was measured showing 3.8 mPa·s.

From the integrated value of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this toluene dispersion, it was confirmed that the dried residue of this toluene dispersion, i.e., reacted composite particles of silica and alumina, had the average unit formula:

$$(H_2SiO_{2/2})_{0.12}(HSiO_{3/2})_{0.03}(SiO_2)_{0.68}(Al_2O_3)_{0.17}$$

FT-IR measurements of the reacted fine composite particles of silica and alumina obtained from the toluene dispersion showed absorption peaks originating from silicon-bonded hydrogen atoms ($SiH_2$ groups and SiH groups). However, the absorption peaks originating from silanol groups and hydroxyl groups had about 50% lower intensity as compared to those peaks originating from the silanol groups and hydroxyl groups of the composite silica-alumina particles prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene and fine composite particles of silica and alumina bonded to hydrogen polysiloxane and dihydrogen polysiloxane.

Example 8

A homogeneous liquid was obtained by vigorously stirring 65.0 g of ethanol, 15.0 g of toluene, and 3.60 g of water for 10 min. at room temperature in the same reactor that was used in Example 1. The liquid was then compounded with 16.6 g (0.080 mole) of tetraethoxysilane, stirred for 1 hour at 30° C., combined with 5.8 g (0.020 mole) of tetraisopropoxy titanium, and stirred for 1 hour at 30° C. Following this, 2.02 g (0.020 mole) of dihydrogen dichlorosilane were added, the mixture was stirred for 1 hours at 30° C., then for 2 hours at 70° C., and a reaction of hydrolysis and condensation was conducted. Following this, the temperature was raised, and hydrochloric acid, ethanol and isopropanol were then removed together with a part of toluene, whereby a toluene dispersion of reacted fine composite particles of silica and titania was obtained (with 15 mass % concentration of solids; 3.5 mPa·s viscosity at 25° C., and 25 nm particle size determined by the dynamic light scattering method). A portion of the obtained colloidal toluene dispersion was sealed in a plastic container, stored for 1 month in a thermostat at 5° C., and then a viscosity of the stored toluene dispersion was measured showing 3.8 mPa·s.

From the integrated values of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this toluene dispersion, it was confirmed that the dried residue of this toluene dispersion, i.e., reacted composite particles of silica and titania, had the average unit formula:

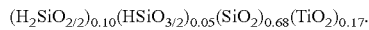

$(H_2SiO_{2/2})_{0.10}(HSiO_{3/2})_{0.05}(SiO_2)_{0.68}(TiO_2)_{0.17}$.

FT-IR measurements of the reacted fine composite particles of silica and titania showed absorption peaks originating from silicon-bonded hydrogen atoms ($SiH_2$ groups and SiH groups). However, the absorption peaks originating from silanol groups and hydroxyl groups had about 50% lower intensity as compared to those peaks originating from the silanol groups and hydroxyl groups of the composite particles of silica and titania prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene and fine composite particles of silica and titania bonded to hydrogen polysiloxane and dihydrogen polysiloxane.

Example 9

The same reactor as in Example 1 was loaded with 300 ml of toluene containing 1.0 g of sodium octyl sulfonate and with 100 ml of a concentrated hydrochloric acid. The mixture was stirred and cooled to a temperature below ±5° C. A liquid mixture composed of 10 g of toluene, 9.6 g of hydrogen trichlorosilane, 7.3 g of dihydrogen dichlorisilane, and 4.3 g of a toluene dispersion of colloidal silica (40 mass % of solids; the product of NISSAN CHEMICAL INDUSTRIES, LTD.; Trademark: TOL-ST; average particle size: 10 nm top 20 nm) was added by dripping to the first-mentioned mixture under stirring conditions and at a temperature below 5° C. Upon completion of dripping, the mixture was stirred for 1 hour at room temperature, an organic layer was separated by means of a separating funnel, was washed with water, and dried by adding an anhydrous magnesium sulfate powder. The drying agent was separated by filtering, the toluene contained in the filtrate was removed by heating under a reduced pressure, and after drying in vacuum a liquid composition was obtained. Molecular-weight distribution of the obtained liquid composition measured by GPG produced a plurality of peaks and peak analysis showed that the weight-average molecular weight was equal to $5.0 \times 10^3$.

From the integrated value of a signal peak at −50.1 ppm originated by $H_2SiO$ units, the integrated value of a signal peak at −84.5 ppm originated by $HSiO_{3/2}$ units, and the integrated value of a signal peak at −112.4 ppm originated by $SiO_2$ units in the $^{29}$Si-NMR spectrum of this liquid composition, it was confirmed that the dried residue of this liquid composition had the average unit formula: $(H_2SiO_{2/2})_{0.38}(HSiO_{3/2})_{0.41}(SiO_2)_{0.20}$.

FT-IR measurements of the reacted fine silica particles showed absorption peaks at 2264 cm$^{-1}$ and 2200 cm$^{-1}$ originating from silicon-bonded hydrogen atoms ($SiH_2$ groups and SiH groups). However, the absorption peaks originating from silanol groups had about 50% lower intensity as compared to those peaks of the fine silica particles prior to the reaction. Similarly, in the $^{29}$Si-NMR spectral analysis, the signal peak at −102.4 ppm originating from SiOH also noticeably dropped. Thus, the result of the analysis showed that the aforementioned liquid composition was a curable liquid composition consisting mainly of toluene, fine silica particles bonded to hydrogen polysiloxane and dihydrogen polysiloxane, and hydrogen polysiloxane resin in a free state.

Example 10

The same reactor as in Example 1 was loaded with 200 ml of toluene and 24.8 g (0.25 mole) of dihydrogen dichlorisilane. The mixture was stirred and cooled to a temperature below 5° C. A liquid mixture composed of 30 g of toluene and 30 g of a toluene dispersion of colloidal silica (40 mass % of solids; the product of NISSAN CHEMICAL INDUSTRIES, LTD.; Trademark: TOL-ST; average particle size: 10 nm top 20 nm) was added during 30 min. by dripping to the first-mentioned mixture under stirring conditions and at a temperature below 5° C. Upon completion of dripping, the mixture was stirred again for 2 hour at room temperature, was combined with 5.4 g (0.30 mole) of water added by dripping during 3 hours under stirring conditions, stirred for 30 min. once more, then gradually cooled to room temperature, stirred for additional 30 min., condensed by removing water and the generated hydrochloric acid together with toluene by distillation in vacuum, passed through a 0.45 micron filter, and diluted with toluene to obtain 25% concentration of solids. The obtained liquid composition had a viscosity of 5.0 mPa·s at 25° C. A portion of the obtained liquid composition was sealed in a plastic container, stored for 1 month in a refrigerator at 5° C., and then the viscosity of the obtained liquid composition was measured showing 3.8 mPa·s.

From the integrated value of a signal peak at −50.1 ppm originated by $H_2SiO$ units, and the integrated value of a signal peak at −112.4 ppm originated by $SiO_2$ units in the $^{29}$Si-NMR spectrum of this liquid composition, it was confirmed that the dried residue of this liquid composition had the average unit formula: $(H_2SiO_{2/2})_{0.44}(SiO_2)_{0.56}$.

FT-IR measurements of the reacted fine silica particles showed absorption peaks at 2264 cm$^1$ and 2200 cm$^1$ originating from silicon-bonded hydrogen atoms ($SiH_2$ groups). However, the absorption peaks originating from silanol groups had about 50% lower intensity as compared to those peaks of the fine silica particles prior to the reaction. Similarly, in the 29Si-NMR spectral analysis, the signal peak at −102.4 ppm originating from SiOH also noticeably dropped. Thus, the result of the analysis showed that the aforementioned liquid composition was a curable liquid composition consisting mainly of toluene, fine silica particles bonded to dihydrogen polysiloxane, and dihydrogen polysiloxane in a free state.

Example 11

The same reactor as in Example 1 was loaded with 30 g of toluene, 4 g of sodium bicarbonate powder (NaHCO$_3$), and 30 g of a toluene dispersion of colloidal silica (40 mass % of solids; the product of NISSAN CHEMICAL INDUSTRIES, LTD.; Trademark: TOL-ST; average particle size: 10 nm top 20 nm), and the mixture was cooled to a temperature below 5° C. under stirring conditions. Following this, 2.48 g (0.025 mole) of dihydrogen dichlorosilane were slowly added to the mixture by dripping at a temperature below 5° C. in a nitrogenous atmosphere. After stirring for 30 min. the reaction solution was cooled to room temperature, then again stirred for 30 min. and subjected to a reaction of condensation. The reaction solution was filtered, the residual sodium bicarbonate was separated by filtering, and as a result, a transparent toluene dispersion of the reacted colloidal silica (with 20 mass % concentration of SiO$_2$, 3.5 mPa·s viscosity at 25° C., and 21 nm particle size determined by a dynamic light scattering method). A portion of the reacted colloidal toluene dispersion was sealed in a plastic container, stored for 1 month in a thermostat at 5° C., and then the viscosity of the stored toluene dispersion was measured showing 3.8 mPa·s.

From the integrated value of a signal peak at −50.1 ppm originated by H$_2$SiO units, and the integrated value of a signal peak at −112.4 ppm originated by SiO$_2$ units in the $^{29}$Si-NMR spectrum of this toluene dispersion, it was confirmed that the dried residue of this toluene dispersion, i.e., reacted fine silica particles, had the average unit formula: (H$_2$SiO$_{2/2}$)$_{0.10}$(SiO$_2$)$_{0.9}$.

FT-IR measurements of the reacted fine silica particles showed absorption peaks at 2264 cm$^{-1}$ and 2200 cm$^{-1}$ originating from silicon-bonded hydrogen atoms (SiH$_2$ groups). However, the absorption peaks originating from silanol groups had about 50% lower intensity as compared to those peaks of the fine silica particles prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene and fine silica particles bonded to dihydrogen polysiloxane.

Example 12

A 1-liter-capacity glass-made reactor vessel equipped with a stirrer, a nitrogen-supply tube, condenser, thermometer, and two injection ports was filled with 257.0 g of a commercially available methanol dispersion silica sol (trademark: MT-ST, the product of NISSAN CHEMICAL INDUSTRIES, LTD.; 30 mass % concentration of SiO$_2$; 12 nm average particle size; 1.8 mass % water content; and 30 nm particle size determined by dynamic light-scattering method), and the contents were cooled to 5° C. After addition of 7.8 g of dihydrogen dichlorisilane (H$_2$SiCl$_2$) by dripping during 30 min., the mixture was stirred for 60 min. at room temperature. Following this, 100 g of isopropanol and 200 g of toluene were added, the mixture was stirred for 30 min., and blowing of nitrogen was continued for another 60 min. under stirring conditions. Hydrogenchloride, methanol and isopropanol were removed together with toluene under a reduced pressure and a temperature below 40° C., whereby a toluene dispersion of the reacted silica fine particles (with 25 mass % concentration of SiO$_2$, 3.5 mPa·s viscosity at 25° C., and 21 nm particle size determined by a dynamic light scattering method) was obtained. A portion of the reacted colloidal toluene dispersion was sealed in a plastic container, stored for 1 month in a thermostat at 5° C., and then a viscosity of the stored toluene dispersion was measured showing 3.8 mPa·s.

From the integrated value of a signal peak at −50.1 ppm originated by H$_2$SiO units, the integrated value of a signal peak at −84.5 ppm originated by HSiO$_{3/2}$ units, and the integrated value of a signal peak at −112.4 ppm originated by SiO$_2$ units in the $^{29}$Si-NMR spectrum of this toluene dispersion, it was confirmed that the dried residue of this toluene dispersion, i.e., reacted fine silica particles, had the average unit formula:

(H$_2$SiO$_{2/2}$)$_{0.10}$(HSiO$_{3/2}$)$_{0.05}$(SiO$_2$)$_{0.85}$.

The HSiO$_{3/2}$ units were included due to branching of the dihydrogen polysiloxane chain.

FT-IR measurements of the reacted fine silica particles showed absorption peaks at 2264 cm$^{-1}$ and 2200 cm$^{-1}$ originating from silicon-bonded hydrogen atoms (SiH$_2$ groups and SiH groups). However, the absorption peaks originating from silanol groups had about 50% lower intensity as compared to those peaks of the fine silica particles prior to the reaction. Similarly, in the $^{29}$Si-NMR spectral analysis, the signal peak at −102.4 ppm originating from SiOH also noticeably dropped. Thus, the result of the analysis showed that the aforementioned toluene dispersion was a curable liquid composition consisting mainly of toluene, and fine silica particles bonded to dihydrogen polysiloxane and to hydrogen polysiloxane.

Example 13

A 1-liter-capacity glass-made reactor vessel equipped with a stirrer, a nitrogen-supply tube, condenser, thermometer, and two injection ports was filled with 257.0 g of a commercially available silica sol dispersed in isopropyl alcohol (trademark: IPA-ST, the product of NISSAN CHEMICAL INDUSTRIES, LTD.; 30 mass % concentration of SiO$_2$; 12 nm average particle size; 1.8 mass % water content; and 30 nm particle size determined by dynamic light-scattering method), and the liquid was diluted by adding 128 g of isopropyl alcohol for bringing concentration of solids to 20%. Following this, 10.4 g of hydrogen trichlorosilane (HSiCl$_3$) were added, and the mixture was stirred for 60 min. at room temperature. Nitrogen gas was then blown into the mixture during 60 min. with a flow rate of 2 L/min, 250 g of toluene were added, and blowing with nitrogen was continued for 30 min. under stirring conditions. Next, isopropyl alcohol and toluene were removed under vacuum at a temperature below 50° C., and the contents of solids were adjusted to 15%. Following this, 100 g of toluene were added, and hydrochloric acid, isopropyl alcohol and a part of toluene were removed at a temperature of 50° C., whereby a toluene dispersion of the reacted silica fine particles (with 15 mass % concentration of SiO$_2$, 3.5 mPa·s viscosity at 25° C., and 21 nm particle size determined by a dynamic light scattering method) was obtained. A portion of the toluene dispersion was sealed in a plastic container, stored for 1 month in a thermostat at 5° C., and then a viscosity was measured showing 3.8 mPa·s.

From the integrated value of a signal peak at −84.5 ppm originated by $HSiO_{3/2}$ units, and the integrated value of a signal peak at −112.4 ppm originated by $SiO_2$ units in the $^{29}Si$-NMR spectrum of this toluene dispersion, it was confirmed that the dried residue of this toluene dispersion, i.e., reacted fine silica particles, had the average unit formula: $(HSiO_{3/2})_{0.15}(SiO_2)_{0.85}$.

FT-IR measurements of the solid silica particles obtained from the aforementioned dispersion showed absorption peaks at 2200 cm$^{-1}$ originating from silicon-bonded hydrogen atoms (SiH groups). However, the absorption peaks originating from silanol groups had about 50% lower intensity as compared to those peaks of the fine silica particles prior to the reaction. Similarly, in the $^{29}Si$-NMR spectral analysis, the signal peak at −102.4 ppm originating from SiOH also noticeably dropped. Thus, the result of the analysis showed that the aforementioned toluene dispersion was a curable liquid composition consisting mainly of toluene and fine silica particles bonded to hydrogen polysiloxane and hydrogen polysiloxane resin.

Example 14

The same reactor as in Example 1 was filled with 200 ml of toluene and 24.8 (0.25 mole) of dihydrogen dichlorosilane under a nitrogenous atmosphere, and the contents were cooled to a temperature below −5° C. under stirring conditions. A mixture consisting of 30 g of toluene and 30 g of colloidal titanium oxide dispersed in methyl isobutyl ketone (colloidal titanium oxide of Sukgyung A•T Co., Ltd.; Model No. SG-T015SMI; average particle size of 20 to 30 nm; 20 wt. % concentration) was added under stirring condition by dripping during 30 min. at a temperature below 5° C. Upon completion of dripping, the mixture was stirred again for 2 hours, and 5.4 g (0.30 mole) of water were added by dripping under stirring conditions during 3 hours. After stirring for 30 min., the contents were gradually cooled to room temperature, stirred again for 30 min., and then water, hydrochloric acid, methyl isobutyl ketone and so on were removed together with a part of toluene by distillation in vacuum, and the residue was condensed. The condensed residue was passed through a 0.45 micron filter, and the content of solids were adjusted by toluene to 20 mass %. A portion of the toluene dispersion was sealed in a plastic container, stored for 1 month in a thermostat at 5° C., and then the viscosity of the stored toluene dispersion was measured showing 3.8 mPa·s.

From the integrated value of a signal peak at −50.1 ppm originated by $H_2SiO$ units, and the integrated value of a signal peak at −84.5 ppm originated by $HSiO_{3/2}$ units in the $^{29}Si$-NMR spectrum of this toluene dispersion, it was confirmed that the dried residue of this toluene dispersion had the average unit formula: $(H_2SiO_{2/2})_{0.24}(HSiO_{3/2})_{0.53}(TiO_2)_{0.23}$.

The $HSiO_{3/2}$ units were included due to branching of dihydrogen polysiloxane chain.

FT-IR measurements of the reacted fine titanium oxide particles showed absorption peaks at 2264 cm$^{-1}$ and 2200 cm$^{-1}$ originating from silicon-bonded hydrogen atoms (SiH$_2$ groups and SiH groups). However, the absorption peaks originating from silanol groups had about 50% lower intensity as compared to those peaks of the fine titanium oxide particles prior to the reaction. Similarly, in the $^{29}Si$-NMR spectral analysis, the signal peak at 102.4 ppm originating from SiOH also noticeably dropped. Thus, the result of the analysis showed that the aforementioned toluene dispersion was a curable liquid composition consisting mainly of toluene, fine titanium oxide particles bonded to dihydrogen polysiloxane and hydrogen polysiloxane, and hydrogen polysiloxane in a free state.

Example 15

The curable liquid composition obtained in Example 4 and consisting mainly of toluene, fine silica particles bonded to hydrogen polysiloxane and dihydrogen polysiloxane, as well as of hydrogen polysiloxane resin in a free state was applied by a spin coater onto one side of a 24 μm-thick stainless steel substrate with surface roughness $R_{max}$ of 56.7 nm, i.e., onto a stainless steel foil (150×150 mm). The coating was heated for 2 hours at 200° C. and then for 1 hour at 600° C., whereby a flexible stainless steel substrate having on one side a 1.8 μm-thick thin silica-type coating layer was obtained.

Measurement of roughness by AFM on the surface of the silica-type coating layer showed a value of $R_{max}$ equal to 6.1 nm. FT-IR analysis of the silica-type coating layer showed absorption peaks at 2264 cm$^{-1}$ and 2200 cm$^{-1}$ originating from silicon-bonded hydrogen atoms (SiH$_2$ groups and SiH groups). The hardness of the silica-type coating layer was 9H, and the silica-type coating layer had electrical insulating properties. The obtained flexible stainless steel substrate with the silica-type coating layer was held by fingers at both ends and bent many times with a bending angle of 180°. However, the silica-type coating layer did not show any cracks or peelings.

The obtained flexible stainless steel substrate with the silica-type coating layer was heated in air or in nitrogen gas during 1 hour at a temperature of 600° C. Observation showed that after heating the silica-type coating layer remained tightly adhered to the substrate and was free of cracks.

Example 16

The curable liquid composition obtained in Example 7 and consisting mainly of toluene and fine composite particles of silica and alumina bonded to hydrogen polysiloxane and dihydrogen polysiloxane was applied by a spin coater onto one side of a 24 μm-thick stainless steel substrate, i.e., a stainless steel foil (150×150 mm) with surface roughness $R_{max}$ of 56.7 nm. The coating was heated for 2 hours at 200° C. and then for 1 hour at 600° C., whereby a flexible stainless steel substrate having on one side a 2.8 μm-thick silica-type coating layer containing the reacted fine composite silica-alumina particles was obtained.

Measurement of roughness by AFM on the surface of the silica-type coating layer showed a value of $R_{max}$ equal to 5.1 nm. FT-IR analysis of the silica-type coating layer showed absorption peaks at 2264 cm$^{-1}$ and 2200 cm$^{-1}$ originating from silicon-bonded hydrogen atoms (SiH$_2$ groups and SiH groups). The hardness of the silica-type coating layer was 9H, and the silica-type coating layer had electrical insulating properties. The obtained flexible stainless steel substrate with the silica-type coating layer that contained the reacted fine composite particles of silica and alumina was held by fingers at both ends and bent many times with a bending angle of 180°. However, the silica-type coating layer did not show any cracks or peelings.

The obtained flexible stainless steel substrate with the silica-type coating layer was heated in air or in nitrogen gas during 1 hour at a temperature of 600° C. Observation showed that after heating the silica-type coating layer remained tightly adhered to the substrate and was free of cracks.

Example 17

The curable liquid composition obtained in Example 14 and consisting mainly of toluene, fine particles of titanium oxide bonded to hydrogen polysiloxane and dihydrogen polysiloxane, as well as of hydrogen polysiloxane and dihydrogen polysiloxane in a free state was diluted with toluene to a content of solids equal to 20 mass % and then applied by a spin coater onto one side of a 24 μm-thick stainless steel substrate, i.e., a stainless steel foil (150×150 mm) with surface roughness $R_{max}$ of 56.7 nm. The coating was heated for 2 hours at 200° C. and then for 1 hour at 600° C., whereby a flexible stainless steel substrate having on one side a 2.0 μm-thick silica-type coating layer containing the reacted fine titanium oxide particles was obtained.

Measurement of roughness by AFM on the surface of the silica-type coating layer showed a value of $R_{max}$ equal to 5.1 nm. FT-IR analysis of the silica-type coating layer showed absorption peaks at 2264 cm$^{-1}$ and 2200 cm$^{-1}$ originating from silicon-bonded hydrogen atoms (SiH$_2$ groups and SiH groups). The hardness of the silica-type coating layer was 9H, and the silica-type coating layer had electrical insulating properties. The obtained flexible stainless steel substrate with the silica-type coating layer containing fine titanium oxide particles was held by fingers at both ends and bent many times with a bending angle of 180°. However, the silica-type coating layer did not show any cracks or peelings.

The obtained flexible stainless steel substrate with the silica-type coating layer was heated in air or in nitrogen gas during 1 hour at a temperature of 600° C. Observation showed that after heating the silica-type coating layer remained tightly adhered to the substrate and was free of cracks.

Example 18

The curable liquid composition obtained in Example 9 and consisting mainly of toluene, fine silica particles bonded to hydrogen polysiloxane and dihydrogen polysiloxane, as well as of hydrogen polysiloxane resin in a free state was diluted with toluene to a content of solids equal to 20 mass % and then applied by dip coating onto both sides of a 75 μm-thick glass plate with surface roughness $R_{max}$ of 30.6 nm. The coating was heated for 2 hours at 450° C. As a result, a flexible thin glass substrate having on both sides 1.5 μm-thick silica-type coating layers containing fine silica particles was obtained.

Measurement of roughness by AFM on the surface of the silica-type coating layer showed a value of $R_{max}$ equal to 1.0 nm. The hardness of the silica-type coating layer was 9H, and the silica-type coating layer had electrical insulating properties. The obtained flexible thin glass substrate with the silica-type coating layers was held by fingers at both ends and bent. However, bending did not cause cracks or peelings in the silica-type coating layers.

The obtained flexible thin glass substrate with silica-type coating layers was heated at a temperature of 600° C. Observation showed that after heating the silica-type coating layers remained tightly adhered to the thin glass substrate with crack-free.

Example 19

The curable liquid composition obtained in Example 3 and consisting mainly of toluene, fine silica particles bonded to hydrogen polysiloxane and dihydrogen polysiloxane, as well as of hydrogen polysiloxane and dihydrogen polysiloxane in a free state was diluted to a solid content of 10 mass % with dibutyl ether which had been dehydrated by means of a molecular sieve. The diluted composition was then applied by blade coating onto one side of the same thin stainless steel substrate as in Example 14 (a 150 mm side square).

The coating was heated for 2 hours at 200° C., whereby a flexible stainless steel substrate having on one side a 2.5 μm-thick semi-cured layer of dihydrogen polysiloxane and hydrogen polysiloxane was produced. In nitrogen gas with 700 ppm oxygen gas concentration, the obtained semi-cured layer of hydrogen polysiloxane and dihydrogen polysiloxane containing fine particles of silica was irradiated with a 200 Mrad electron beam emitted from a 165 kV electron-beam gun, whereby a 2.5 μm-thick silica-type coating layer containing fine silica particles was formed. The silica-type coating layer had tight adherence to the thin stainless steel plate and did not show cracks or peelings when it was held at the ends by fingers and many times bent by 180°.

Based on the decrease of absorption peaks at 2264 cm$^{-1}$ originated from OSiH$_2$ and at 2200 cm$^{-1}$ originated from O$_{1.5}$SiH (which in FT-IR analysis can be considered as adsorption characteristic specific to silicon-bonded hydrogen atoms), it could be assumed that the amount of SiH$_2$ and SiH groups was reduced by about 60%. Furthermore, after heating for 1 hour at 500° C., surface roughness measured by AFM showed a value of $R_{max}$ equal to 10.2 nm. The hardness of the silica-type coating layer was 9H, and the silica-type coating layer had electrical insulating properties. After heating for 1 hour at 600° C., the silica-type coating layer remained tightly adhered to the thin stainless steel substrate and did not have any cracks.

Example 20

The curable liquid composition obtained in Example 10 and consisting mainly of toluene, fine silica particles bonded to dihydrogen polysiloxane, as well as of dihydrogen polysiloxane in a free state was diluted to a solid content of 10 mass % with dibutyl ether which had been dehydrated by means of a molecular sieve. The diluted liquid curable composition was then applied by blade coating onto one side of the same thin stainless steel substrate as in Example 15 (a 150 mm side square). The coating was heated for 12 hours at 200° C., whereby a semi-cured layer of dihydrogen polysiloxane containing fine silica particles bonded to dihydrogen polysiloxane was produced on one side of the thin stainless steel substrate. The obtained thin stainless steel substrate with a semi-cured coating was placed into a polyethylene bag having a 30 cm width and a 20 cm length and filled with 5 vol. % ammonia air where it was held for 2 hours intact for curing. Following this, the product was heated for 1 hour at 500° C., whereby a 1.5 μm-thick silica-type coating layer containing fine silica particles was formed.

Surface roughness $R_{max}$ measured on the surface of the silica-type coating layer by SEM (scanning electronic microscope) gave a value of 8.5 nm. FT-IR observation of the thin silica-type coating layer did not reveal any peak at 2200 cm$^{-1}$ originated from SiH. The hardness of the silica-type coating layer was 9H, and the silica-type layer had electrical insulating properties. After heating for 1 hour at 600° C. in air or in nitrogen gas, the silica-type coating layer remained tightly adhered to the thin stainless steel substrate side and did not have any cracks.

Example 21

Figure 4:
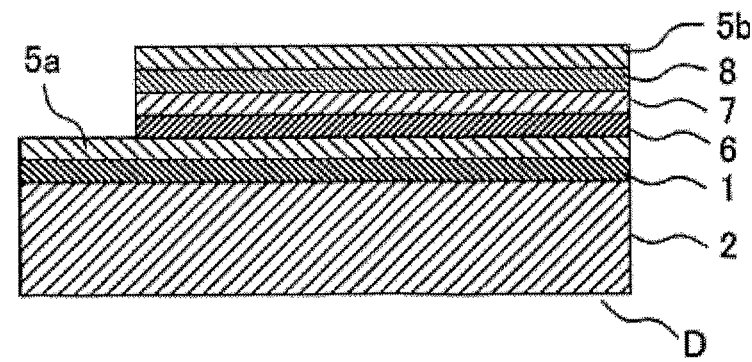
FIG. 4 is a sectional view of a thin-film type compound semiconductor solar cell D.
1 thin silica-type layer
2 thin stainless steel plate
3 thin glass plate
4 thin semiconductor layer
5a Mo back-electrode layer
5b ITO transparent electrode layer
6 CdS high-resistant buffer layer
7 CIGS-type adsorption layer composed of CuInGaSe$_2$
8 ZnO semi-insulating layer

A thin-film compound-type semiconductor solar cell having a cross-section shown in FIG. 4 was produced by sequentially forming the following layers by methods known in the art on the silica-type coating layer formed on the thin stainless-steel substrate obtained in Example 19 or Example 20: a Mo back-electrode layer; a CIGS-type light-absorption layer composed of $CuInGaSe_2$; a CdS high-resistant buffer layer; a ZnO semi-insulation layer; and ITO transparent electrode layer. The obtained thin-film solar cell demonstrated high light-conversion efficiency.

Comparative Example 1

A commercially available toluene dispersion of colloidal silica (40 mass % of solids; the product of Nissan Chemicals, Co., Ltd.; trademark: TOL-ST; average particle size: 10 nm to 20 nm) was mixed with liquid hydrogen polysiloxane resin (average unit formula: $(H_2SiO_{2/2})_{0.25}(HSiO_{3/2})_{0.75}$; weight-average molecular weight: $6.0\times10^3$; viscosity: 8,000 mPa·s) in an mass ratio of 1 to 1. The mixture was adjusted by toluene to 30 mass % of solids. Within a few minutes the resultant toluene dispersion turned into a gel.

Comparative Example 2

In accordance with Kokai H11-106658, i.e., JP11-106658 A, hydrogen triethoxysilane was dissolved in ethanol, and the ethanol solution was stirred under ice-bath cooling conditions. Following this, water was added in an amount of 3 times by mole the amount of the hydrogen trimethoxysilane by dripping into the ethanol solution. Upon completion of dripping, the mixture was stirred at room temperature, the precipitate was separated by filtering, the ethanol was removed from the filtrate, and the residue was dried in vacuum to obtain a hydrogen polysilsequioxane resin. The obtained hydrogen polysilsequioxane resin was dissolved to 30 mass % solids in a methyl isopropyl ketone which had been dehydrated by means of molecular sieves. Mixing of a commercially available methyl isobutyl ketone dispersion of the colloidal silica (the product of NISSAN CHEMICAL INDUSTRIES, LTD.; trademark: MIBK-ST; 30 mass % of solids; average particle size: 10 nm to 20 nm) in a 1:1 ratio with the aforementioned hydrogen polysilsequioxane resin solution caused formation of an insoluble precipitate in the resultant dispersion.

INDUSTRIAL APPLICABILITY

The curable liquid composition of the present invention is useful for forming a hard silica-type layer that contains fine particles of a polyvalent metal oxide on an inorganic substrate.

The method of forming a coating on an inorganic substrate of the present invention is useful for forming a hard silica-type layer which tightly adheres to the aforementioned substrate, is free of non-uniformity and unevenness, and is resistant to cracking.

The inorganic substrate that has a hard silica-type layer of the present invention is useful as a substrate for electronic devices such as thin-film solar batteries, thin-film transistors (TFT) used in reflection-type liquid crystal displays, devices and elements used in thin-film electroluminescent displays, and as a substrate for electrodes in thin-film-type lithium batteries.

The semiconductor device of the present invention is useful as thin-film solar batteries, thin-film transistors (TFT) of reflection-type liquid crystal displays, thin-film semiconductor devices or elements of thin-film electroluminescent displays, thin-film lithium batteries, etc.

The invention claimed is:
1. A method of producing a curable liquid composition comprising subjecting a silane compound represented by the following general formula (1A):

$H_2SiX_2$, or a mixture of a silane compound represented by the general formula (1A) and a silane compound represented by the following general formula (1B):

$HSiX_3$ where X represents a halogen atom or an alkoxy group with 1 to 4 carbon atoms, to a reaction of condensation, or to a reaction of hydrolysis with condensation, in an organic solvent that contains dispersed fine particles of polyvalent metal oxide having hydroxyl groups.

2. The method of producing the curable liquid composition of claim 1, wherein the aforementioned fine particles of the polyvalent metal oxide are fine particles of silica, titanium oxide, zirconium oxide, alumina oxide, zinc oxide, tin oxide, composite fine particles of silica and titanium oxide, composite fine particles of silica and zirconium oxide, or composite fine particles of silica and alumina.

3. The method of producing the curable liquid composition of claim 1, wherein the silane compound is represented by one or more types of silane compounds selected from the group consisting of dihydrogen dichlorosilane, hydrogen trichlorosilane, dihydrogen dimethoxysilane, dihydrogen diethoxysilane, hydrogen trimethoxysilane, or hydrogen triethoxysilane.

4. A method of coating an inorganic substrate comprising coating the inorganic substrate with the curable liquid composition produced by the method of claim 1, and subsequently curing curable components of the coating, whereby a silica-based layer that contains fine particles of polyvalent metal oxide and that has a pencil hardness in the range of 4H to 9H is formed on the inorganic substrate.

5. The method of coating an inorganic substrate according to claim 4, wherein curing is carried out by heating at a temperature no less than 150° C. in an oxygen-containing atmosphere, heating at a temperature no less than 200° C. in an inert gas or in a vacuum, irradiating with a high-energy beam, exposing to ozone, exposing to nitrous oxide gas, or exposing to wet ammonia gas.

6. An inorganic substrate characterized by having a silica-based layer that contains fine particles of polyvalent metal oxide and that has a pencil hardness in the range of 4H to 9H, which has been manufactured by coating an inorganic substrate with a curable liquid composition produced by the method of claim 1, and subsequently curing curable components of the coating.

7. A semiconductor device that has the inorganic substrate of claim 6 With the silica-based layer that contains fine particles of a polyvalent metal oxide, wherein a semiconductor layer is formed at least on the silica-based layer.

8. The semiconductor device of claim 7, wherein the inorganic substrate is a thin glass plate or a thin stainless steel plate, the semiconductor layer is a thin silicon semiconductor layer, or a compound-type semiconductor layer, and wherein the semiconductor device is a thin film solar cell.

* * * * *